US010862507B2

(12) United States Patent
Stenström

(10) Patent No.: US 10,862,507 B2
(45) Date of Patent: Dec. 8, 2020

(54) VARIABLE-SIZED SYMBOL ENTROPY-BASED DATA COMPRESSION

(71) Applicant: ZEROPOINT TECHNOLOGIES AB, Gothenburg (SE)

(72) Inventor: Per Stenström, Torslanda (SE)

(73) Assignee: ZEROPOINT TECHNOLOGIES AB, Gothenburg (SE)

( * ) Notice: Subject to any disclaimer, the term of this patent is extended or adjusted under 35 U.S.C. 154(b) by 249 days.

(21) Appl. No.: 16/087,630

(22) PCT Filed: Mar. 20, 2017

(86) PCT No.: PCT/SE2017/050265
§ 371 (c)(1),
(2) Date: Sep. 21, 2018

(87) PCT Pub. No.: WO2017/171611
PCT Pub. Date: Oct. 5, 2017

(65) Prior Publication Data
US 2020/0304146 A1    Sep. 24, 2020

(30) Foreign Application Priority Data
Mar. 31, 2016 (SE) .................................. 1650426

(51) Int. Cl.
*H03M 7/40* (2006.01)

(52) U.S. Cl.
CPC ....... *H03M 7/4093* (2013.01); *H03M 7/4031* (2013.01)

(58) Field of Classification Search
CPC .......................... H03M 7/4093; H03M 7/4031
(Continued)

(56) References Cited

U.S. PATENT DOCUMENTS

2014/0152475 A1* 6/2014 Cho ..................... H03M 7/30
                                                    341/87
2016/0099723 A1* 4/2016 Kletter ............... H03M 7/3088
                                                    341/51
(Continued)

FOREIGN PATENT DOCUMENTS

WO     WO 00/36751 A1     6/2000

OTHER PUBLICATIONS

Kozuch, M et al. "Compression of embedded system programs; Computer Design: VLSI in Computers and Processors", 1994. ICCD '94. Proceedings; IEEE International Conference on Cambridge, MA, USA Oct. 10-12, 1994, Publication date Oct. 10, 1994; Los Alamitos, CA, USA, IEEE Comput. Soc; p. 270-277.
(Continued)

*Primary Examiner* — Peguy Jean Pierre
(74) *Attorney, Agent, or Firm* — Ballard Spahr LLP

(57) ABSTRACT

Methods, devices and systems for data compression and decompression are disclosed. A collection of data is obtained. The collection of data is sampled to establish, for a plurality of different symbol sizes, relative frequencies of symbols of the respective sizes in the collection of data. A code is generated to contain variable-length codewords by entropy encoding sampled symbols in the collection of data based on a metric which reflects the relative frequencies of the sampled symbols as well as their sizes. Symbols in the collection of data are compressed into compressed representations using the generated code, wherein the compressed representation of a symbol comprises a codeword which represents the symbol as well as metadata for decompressing the compressed representation.

21 Claims, 19 Drawing Sheets

(58) Field of Classification Search
USPC .............................................. 341/50, 51, 67
See application file for complete search history.

(56) References Cited

U.S. PATENT DOCUMENTS

2016/0254824 A1* 9/2016 Blanchflower ..... H03M 7/6088
　　　　　　　　　　　　　　　　　　　　　　　　　341/87
2020/0186047 A1* 6/2020 Sen ................... H02M 3/33576

OTHER PUBLICATIONS

International Search Report and Written Opinion dated Jun. 15, 2017 by the International Searching Authority for International Application No. PCT/SE2017/050265, filed on Mar. 20, 2017 and published as WO 2017/171611 on Oct. 5, 2017 (Applicant—Zeropoint Technologies AB) (13 Pages).

International Preliminary Report on Patentability dated May 15, 2018 by the International Searching Authority for International Application No. PCT/SE2017/050265, filed on Mar. 20, 2017 and published as WO 2017/171611 on Oct. 5, 2017 (Applicant—Zeropoint Technologies AB) (15 Pages).

* cited by examiner

Fig 3

VARIABLE-SIZED SYMBOL ENTROPY-BASED DATA COMPRESSION

CROSS REFERENCE TO RELATED APPLICATIONS

This application is a U.S. National Phase Application of International Application No. PCT/SE2017/050265, filed Mar. 20, 2017, which claims priority to Swedish Application SE 1650426-8, filed Mar. 31, 2016, both of which applications are hereby incorporated by reference in their entireties.

TECHNICAL FIELD

This invention generally relates to the field of data compression, and more particularly to data compression in data communications devices and data memories in electronic computers. Even more specifically, the invention pertains to methods, devices and systems configured to sample, encode, compress, and decompress, respectively, symbols of variable size using entropy-based data compression principles.

BACKGROUND

Data compression is a general technique to store and transfer data more efficiently by coding frequent collections of data more efficiently than less frequent collections of data. It is of interest to generally store and transfer data more efficiently for a number of reasons. In communications systems, say those building up the Internet, that potentially can connect all physical devices of interest to be globally accessible, it is of interest to transfer data more efficiently, say K times, as it then can be transferred potentially K times faster, using potentially K times less communication capacity and with potentially K times less energy expenditure. In computer memories, for example memories that keep data and computer instructions that processing devices operate on, for example main memory or cache memories, it is of interest to store said data more efficiently, say K times, as it then can reduce the size of said memories potentially by K times, using potentially K times less communication capacity to transfer data between one memory to another memory and with potentially K times less energy expenditure to store and transfer said data inside or between computer systems and/or between memories. Alternatively, one can potentially store K times more data in available computer memory than without data compression. This can be of interest to achieve potentially K times higher performance of a computer without having to add more memory, which can be costly or can simply be less desirable due to resource constraints. For example, on a microprocessor chip there is a limited number of transistors and the size of the cache memories integrated on said chips is constrained by such resource limitation. As another example, the size and weight of a smartphone, a tablet, a lap/desktop or a set-top box are limited as a larger or heavier smartphone, tablet, a lap/desktop or a set-top box could be of less value for an end user; hence potentially lowering the market value of such products. Yet, more memory capacity can potentially increase the market value of the product as more memory capacity can result in higher performance and hence better utility of the product.

To summarize, in the general landscape of computerized products, including isolated devices or interconnected ones, data compression can potentially increase the performance, increase the communication capacity, lower the energy expenditure or lower the cost and area consumed by memory. Therefore, data compression has a broad utility in a wide range of computerized products beyond those mentioned here.

Data compression is a well-studied area. Methods known from prior art fall into lossless and lossy data compression methods. Whereas lossless data compression methods compress data without loss of information, lossy data compression methods trade a higher compression for less accuracy of the data. This is acceptable in some application domains such as in media compression; for example, a human user can accept some loss of information in for example images and audio. As lossy data compression methods, in general, do not resurrect data exactly, they, in general, compress data more efficiently than lossless compression methods. However, in some use cases of data compression, lossy compression methods are inadequate. For example, data content in computer memory must, in general, be captured exactly. As another example, some data transferred on the Internet, such as banking information, must, in general, be captured exactly. In other cases, it is also desired that data compression must be lossless.

One type of lossless data compression, sometimes also used in lossy data compression methods, uses entropy-based encodings. The general idea behind entropy-based encoding is to sort fixed-sized symbols in a collection of data in the order of their relative frequency. For example, assuming that the set of symbols is the set of letters in the alphabet, e.g., "A", "B" and "C" and that the relative frequency of them in a collection of data is known, say 75%, 20% and 5%, respectively, under entropy-based encoding, it is known in prior art how to encode them with variable-sized code lengths optimally using e.g. Shannon's source coding theory with a length determined by $-\log_b P$, where b is the number of symbols (three in the example) and P the frequency (or probability) of occurrence of the symbol. In general, the more frequent is a symbol, the shorter is the length of its code.

There are a number of entropy-based data compression methods known from prior art including unary, arithmetic, Golomb and Huffman among others. Regardless of the particular method, all of them create encodings whose lengths are optimal, i.e., lead to maximum compression according to Shannon's source coding theory, i.e., the encoding is assigned based on the probability of individual symbols. In the well-known Huffman method there are known methods for how to establish the relative frequency of individual symbols. There are also known methods for how to assign Huffman codes to individual symbols whose lengths are optimal. For example, one can assign codes to the symbols according to a specific binary tree, which is constructed bottom-up and left-to-right according to the frequency of occurrence of the symbols or their probabilities. The tree can be binary, meaning two nodes per parent node, quaternary, or in general N-ary depending on how many child nodes each parent node has.

The present inventor has made inventive understandings as follows. Optimality, however, assumes that symbols to be compressed have the same size. As the following example reveals, variable-sized symbols cannot be dealt with optimally by entropy-based data compression methods. As an example, assume the symbols are a combination of the capital letters in the English alphabet, that is, "A", "B", "C", ..., "Z" encoded with 7-bit ASCII codes. Based on the relative frequency of each of these symbols, it is well known how to establish entropy-based codes whose length would optimally match the relative frequencies if a symbol were a single letter. However, if we consider groups of four characters each in a string of text (in this case formed by capital letters), for example, "GIRLGIRLGIRLGIRLLRIG", it would be preferable to consider symbols comprising the size of four letters rather than individual letters and form entropy-based codes using four-character symbols rather than single-character symbols. While "G", "I", "R" and "L" appear with a probability of 25% each, considering one-letter symbols, the symbol "GIRL" appears with a probability of 80% each, considering four-letter symbols.

In the general case, the present inventor has realized that it would be preferred to be able to deal with symbols of variable size. Entropy-based encoding methods in prior art assume that all symbols have the same size and can therefore not optimally encode symbols with varying size. In summary, the disclosed invention allows entropy-based encoding methods to create encodings using symbols of variable size.

SUMMARY

It is accordingly an object of the invention to offer improvements in the technical field referred to above.

A first aspect of the present invention is a data compression method, comprising:

obtaining a collection of data;

sampling said collection of data to establish, for a plurality of different symbol sizes, relative frequencies of symbols of the respective sizes in said collection of data;

generating a code comprising variable-length codewords by entropy encoding sampled symbols in said collection of data based on a metric which reflects the relative frequencies of the sampled symbols as well as their sizes; and compressing symbols in said collection of data into compressed representations using the generated code, wherein the compressed representation of a symbol comprises a codeword which represents the symbol as well as metadata for decompressing the compressed representation.

A second aspect of the present invention is a data compression device, comprising:

a sampler configured to sample a collection of data to establish, for a plurality of different symbol sizes, relative frequencies of symbols of the respective sizes in said collection of data;

an encoder configured to generate a code comprising variable-length codewords by entropy encoding sampled symbols based on a metric which reflects the relative frequencies of the sampled symbols as well as their sizes; and a compressor configured to compress symbols in said collection of data into compressed representations using the generated code, wherein the compressed representation of a symbol comprises a codeword which represents the symbol as well as metadata for decompressing the compressed representation.

A third aspect of the present invention is a data decompression method, comprising:

obtaining a compressed block comprising compressed representations of variable-sized symbols;

retrieving a compressed representation comprised in said compressed block;

retrieving metadata comprised in said compressed representation;

retrieving a codeword comprised in said compressed representation; and decompressing said retrieved codeword into a symbol having one among a plurality of different sizes using the retrieved metadata and a code comprising variable-length, entropy encoded codewords, the entropy encoding of said codewords being based on a metric which reflects relative frequencies of symbols as well as their sizes.

A fourth aspect of the present invention is a data decompression device comprising a decompressor, the decompressor being configured to obtain a compressed block comprising compressed representations of variable-sized symbols;

the decompressor being configured to retrieve a compressed representation in said compressed block;

the decompressor being configured to retrieve metadata comprised in said compressed representation;

the decompressor being configured to retrieve a codeword comprised in said compressed representation; and the decompressor being configured to decompress said retrieved codeword into a symbol having one among a plurality of different sizes using the retrieved metadata and a code comprising variable-length, entropy encoded codewords, the entropy encoding of said codewords being based on a metric which reflects relative frequencies of symbols as well as their sizes.

A fifth aspect of the present invention is a system comprising one or more memories, a data compression device according to the second aspect above and a data decompression device according to the fourth aspect above.

A sixth aspect of the present invention is a computer program product comprising code instructions which, when loaded and executed by a processing device, cause performance of the method according to the first aspect above.

A seventh aspect of the present invention is a computer program product comprising code instructions which, when loaded and executed by a processing device, cause performance of the method according to the third aspect above.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

DESCRIPTION OF DRAWINGS

FIG. 3 depicts an exemplary collection of data and how value frequency is established considering fixed-sized symbols.

DETAILED TECHNICAL DESCRIPTION

Figure 1:
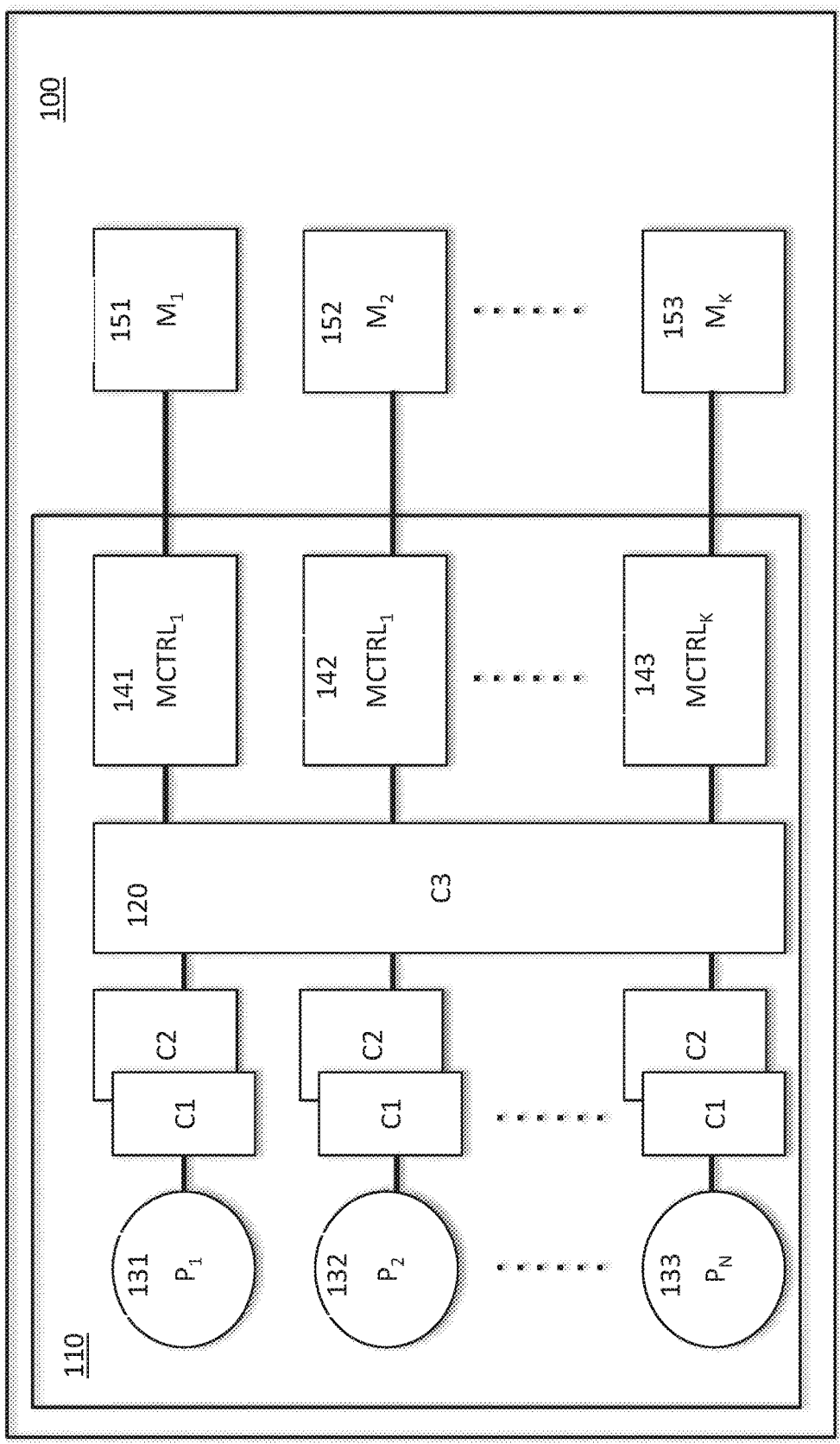
FIG. 1 depicts a computer system comprising a microprocessor chip with one or a plurality of processing units, an exemplary cache hierarchy of three levels, and one or a plurality of memory controllers connected to one or a plurality of off-chip memories.

An example of a computer system 100 is depicted in FIG. 1. This system comprises a microprocessor chip 110 and one or a plurality of memory modules denoted $M_1$ 151, $M_2$ 152 through $M_K$ 153. The microprocessor chip could be a discrete system or integrated on a system-on-a-chip (SoC) in any available technology. The microprocessor chip 110 comprises one or several processing units, denoted $P_1$ 131, $P_2$ 132 through $P_N$ 133, sometimes called CPU or core, and a memory hierarchy. The memory hierarchy, on the other hand, comprises several cache levels, e.g. three levels as is shown exemplary in FIG. 1 and denoted C1, C2, and C3. These levels can be implemented in the same or different memory technologies, e.g. SRAM, DRAM, or any type of non-volatile technology including for example Phase-Change Memory (PCM). The number of cache levels may vary in different examples and the example 100 depicts three levels where the last cache level is C3 120. These levels are connected using some kind of interconnection means (e.g. bus or any other interconnection network). In the example, levels C1 and C2 are private to, and only accessible by, a respective processing unit i denoted $P_i$ (e.g. $P_1$ in FIG. 1). It is well known to someone skilled in the art that alternative examples can have any number of private cache levels or, as an alternative, that all cache levels are shared as illustrated by the third level C3 120 in FIG. 1. Regarding the inclusion of the data in the cache hierarchy, any alternative is possible which can be appreciated by someone skilled in the art. For example, C1 can be included in C2 whereas C2 can be non-inclusive with respect to level C3. Someone skilled in the art can appreciate alternative examples. The computer system 100 of FIG. 1 comprises one or a plurality of memory controllers, denoted $MCTRL_1$ 141, $MCTRL_2$ 142, through $MCTRL_K$ 143. The last cache level (C3 in FIG. 1) is connected to the memory controllers, which in turn are connected to one or a plurality of memory modules $M_1$ 151, $M_2$ 152, - - - . $M_k$ 153 which can be implemented in the same or different memory technologies, e.g. SRAM, DRAM, or any type of non-volatile technology including for example Phase-Change Memory (PCM). The memory controllers can be integrated on the microprocessor chip 110 or can be implemented outside the microprocessor chip. Finally, a computer system runs one or more tasks. A task can be any software application or part of it that can run on the particular system.

Computer systems, as exemplified by the example in FIG. 1, can suffer from a limited capacity of the memory modules denoted $M_1$ 151 through $M_K$ 153 and of the cache memories, regardless of level (e.g. C1, C2 and C3 in FIG. 1). A limited cache capacity can manifest itself as a higher fraction of memory requests having to be serviced at the next level in the memory hierarchy leading to loss in performance or higher energy consumption. To mitigate this problem, one can consider increasing cache capacity, thereby lowering the number of requests that need to be serviced by the next level of the memory hierarchy. Increasing the capacity of the cache levels on a microprocessor chip will lead to a number of problems. First, the cache access request time can increase leading to performance loss. Second, the energy consumed on an access request to a larger cache can potentially be higher. Third, using up more of the silicon or equivalent material on the microprocessor chip to realize larger cache levels may have to be traded for less processing capabilities. It is therefore desirable to realize more cache capacity without the problems identified above. A limited memory capacity has similar problems and can manifest itself in more memory requests that will have to be serviced at the next level of the memory hierarchy typically realized as the storage level of the memory hierarchy. Such storage-level accesses are slower and may result in considerable loss in performance and energy expenditure. Increasing the memory capacity can mitigate these drawbacks. However, more memory capacity can increase the cost of the computer system both at the component level and in terms of energy expenditure. In addition, more memory consumes more space, which may limit the utility of the computer system in particular in form-factor constrained products including for example mobile computers (e.g., tablets, smart phones, wearables and small computerized devices connected to the Internet (a.k.a. Internet of Things (IoT) devices)).

Figure 2:
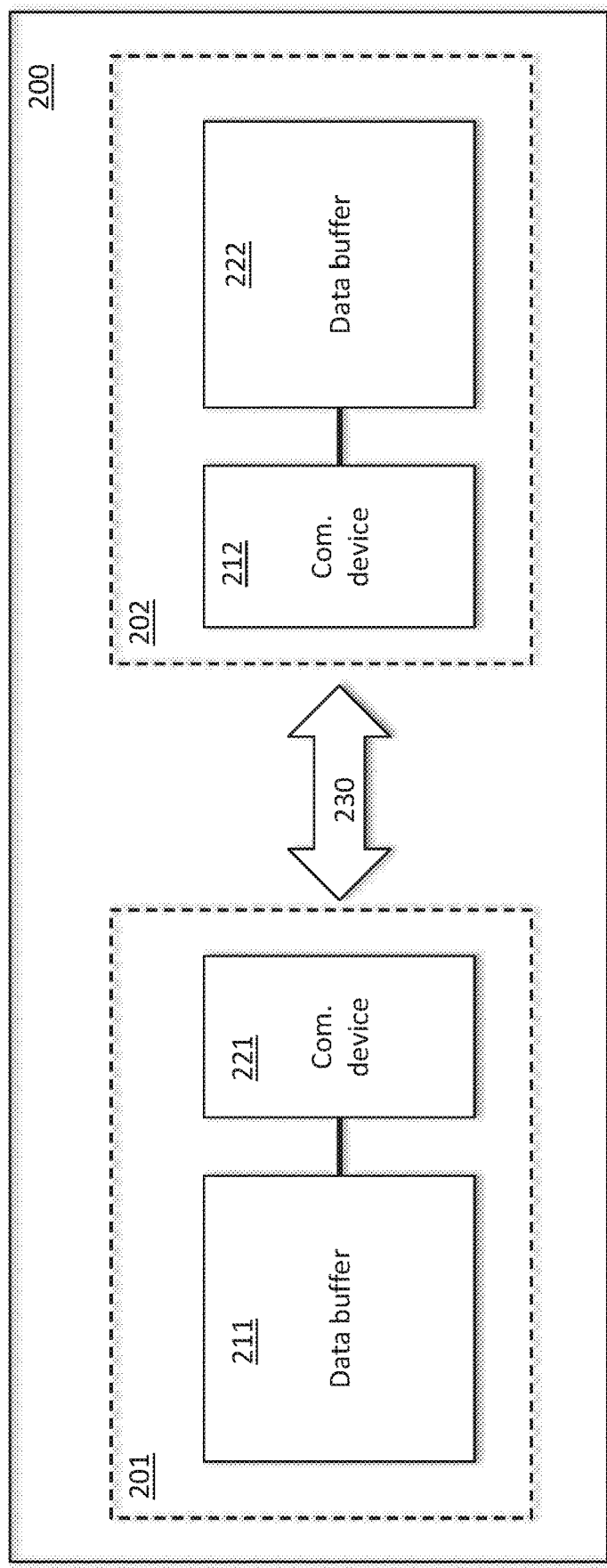
FIG. 2 depicts a communication device comprising a data buffer storing a collection of data to be transferred to a peer communication device comprising a data buffer to store the transferred collection of data.

Let us now turn the attention to an alternative example as depicted in FIG. 2. FIG. 2 illustrates an exemplary data communication system 200 of communication devices 221 and 212 in two computerized sub-systems 201, 202 with the ability to communicate over a communication link 230. Each of the two communication devices 221 and 212 can communicate with one or a plurality of such communication devices, although in the exemplary system only two communication devices are shown. The communication devices can adhere to a communications protocol, e.g. TCP/IP, which typically has a number of standardized protocol levels. Typically, the task of a communication device is to transfer a collection of data from one point to another. For example, and as illustrated in FIG. 2, this task may involve the transfer of a collection of data from communication device 221 to communication device 212. The collection of data to be transferred is typically stored in a data buffer 211 accessible by communication device 212 and, analogously, the receiving communication device 221 typically deposits the received collection of data in a corresponding data buffer 222.

It is well known that data communication systems may suffer from a limited communication capacity. This may manifest itself in longer time to transfer a collection of data from one communication device to another. One can mitigate a limited communication capacity by increasing the capacity of the communication link 230. However, this may increase the cost of the data communication system both concerning component and infrastructure cost and energy expenditure.

Data compression can alleviate the problems of limited memory and communication capacity in each of the examples of FIGS. 1 and 2, and, more generally, in alternative examples as appreciated by someone skilled in the art. By way of example, referring back to FIG. 1, one can compress the data stored in the memory modules denoted $M_1$ 151 through $M_K$ 153. A first effect of the increased memory capacity is to be able to store more data in the available memory. A second effect is to allow data to be more effectively transferred from memory to the cache hierarchy on the microprocessor chip 110 in FIG. 1 by freeing up communication capacity on the interconnect between memory modules $M_1$ through $M_K$ and memory controllers $MCTRL_1$ 141 through $MCTRL_K$ 143. A third effect is to allow also data to be stored in a compressed format in the cache hierarchy. For example, if data is allowed to be stored in a compressed format in the on-chip cache C3 120 in FIG. 1, it would increase the effective cache capacity which potentially can lead to fewer memory requests that have to be serviced by off-chip accesses, hence resulting in higher performance and/or less energy expenditure.

Figure 3:
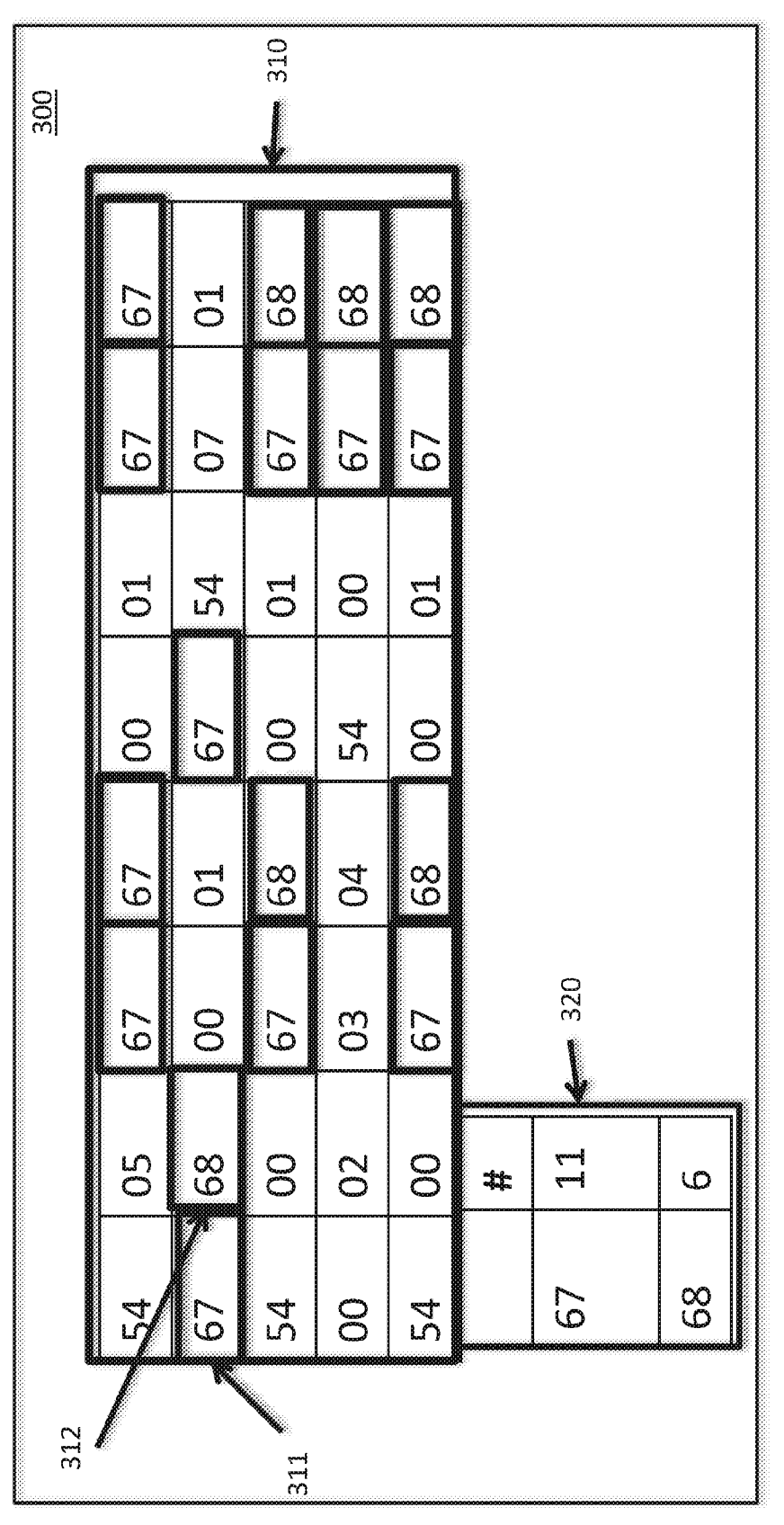

Entropy-based data compression is a class of lossless data compression methods well known per se in the prior art. As input, it considers a collection of data comprising a set of symbols of a certain a priori defined size. By way of example, symbols could comprise the set of capital letters in the English alphabet, i.e., "A", "B", "C", . . . , "Z". Alternatively, symbols could comprise the set of 32-bit integers, i.e., $00000000_{16}$ . . . $FFFFFFFF_{16}$ in hexadecimal notation. In FIG. 3, an exemplary collection of data stored in a memory matrix 310 corresponding to five rows of eight memory locations each, where each location occupies fixed-sized symbols, e.g., 32-bits, exemplary interpreted as decimal numbers. Without loss of generality, but for ease of illustration, let us assume that locations are mapped to memory addresses row-by-row starting from address 0 at the top. That is, the locations of the first row are mapped to memory addresses 0, 1, . . . , 7; the locations of the second row are mapped to memory addresses 8, 9, . . . , 15 etc. In the example memory matrix 310, some values are apparently more common than others. For example, the symbol with the decimal value 67, e.g. in location 311, and the symbol with the decimal value 68, e.g. in location 312 occur 11 and 6 times, respectively, whereas e.g. the symbol with the decimal value 02 only occurs once.

The idea behind entropy-based data compression is to code more frequent symbols with fewer bits than less frequent symbols. To generate such encodings, one must establish frequencies of occurrence of each symbol in a collection of data. The exemplary frequency table 320 of FIG. 3 partially shows the frequency information for the two most frequent symbols in memory matrix 310. This frequency table shows that symbols 67 and 68 occur 11 and 6 times, respectively. For ease of illustration, let us assume that compressed values of symbols 67 and 68 can be eliminated. As the memory matrix comprises 45 locations and 17 of these locations are occupied by either symbol 67 or 68, one would then be able to extend the memory capacity by a factor 45/(45−17)=1.6.

Figure 4:
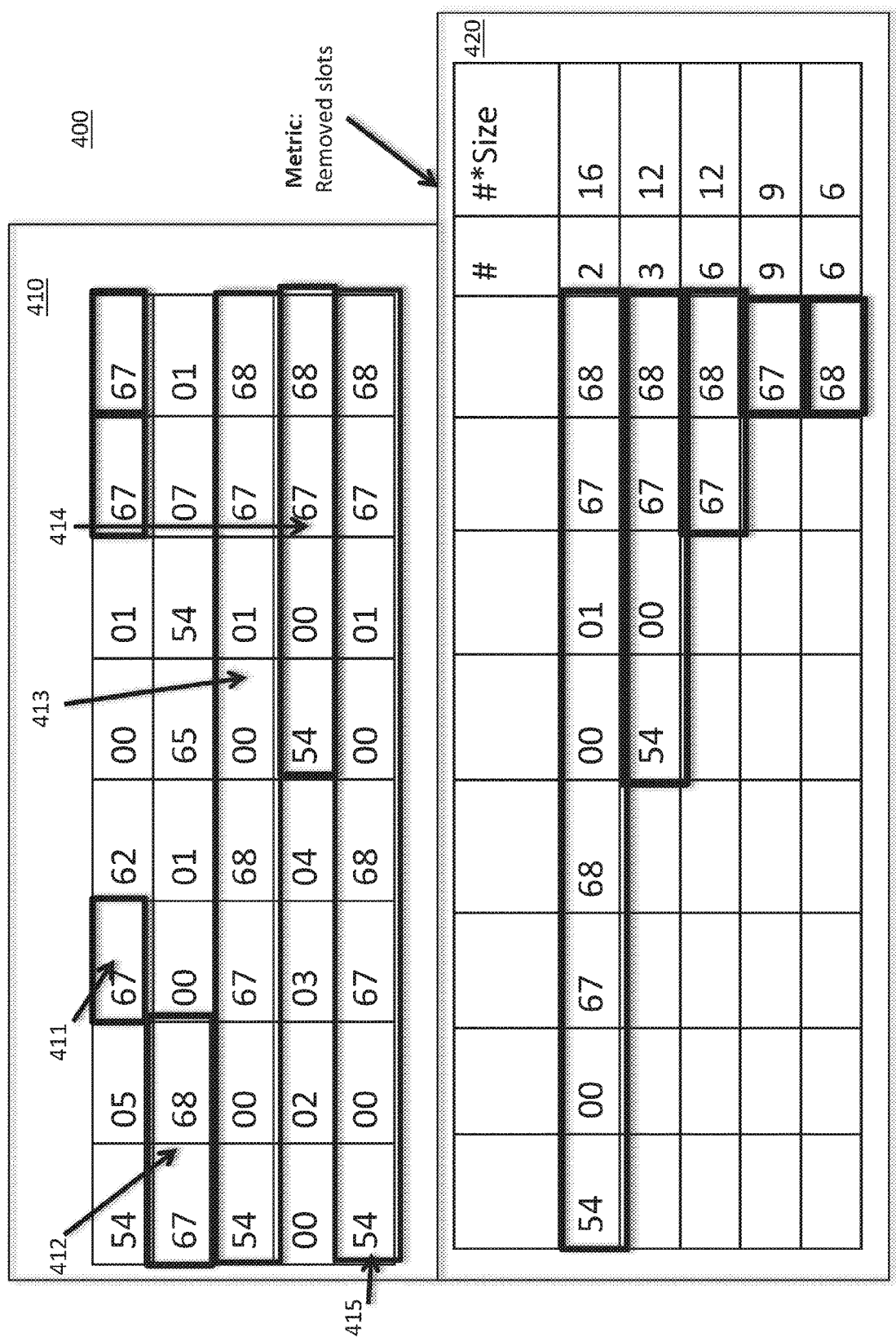
FIG. 4 depicts an exemplary collection of data and how value frequency is established considering variable-sized symbols.

Tracking frequencies of symbols of an a priori and fixed size, as suggested by prior art, can however lead to missed compression opportunities as illustrated in FIG. 4 which shows an exemplary memory matrix 410 with the same content as the memory matrix 310 of FIG. 3. Instead of restricting ourselves to consider symbol sizes dictated by the size of a single memory location (e.g. 32 bits), let us consider symbols spanning multiple, consecutive memory locations. For example, let us consider symbols being the same size as a row in the memory matrix of FIG. 4. We can see that the symbol corresponding to the second row 413, that is, "54 00 67 68 00 01 67 68" is the same as the one in the fourth row. Considering now symbols spanning half a row, the second half-row of the third row 414 has the same symbol as the first half-row of the second and the fourth row. Considering now instead a quarter of the row, denoting the first quarter of a row as first quarter-row, the second quarter of a row the second quarter-row etc., we note that the first quarter-row of the first row 412 has the same symbol as the second and fourth quarter-rows of the third row 413 and fifth row 415, respectively. The frequency table 420 shows the number of occurrences of each of the symbols in the memory matrix 410, not taking into account whether a symbol i of size $S_i$ is included in a symbol j of size $S_j$ where $S_i < S_j$. For example, symbol 413 "54 00 67 68 00 01 67 68" occurs twice whereas symbol 412 "67 68" and symbol 411 "67" occur six and nine times, respectively.

If one would only consider symbols of the same size, as in the prior art, ordering symbols in descending order of occurrence, as done in the frequency table 420, would dictate how to assign entropy-based codes to the symbols. Concretely, symbols with a higher frequency would be assigned codes with shorter lengths than symbols with a lower frequency. However, when considering symbols that differ in size, simply considering the frequency of symbols does not appear sufficient. First of all, two symbols i and j with the same frequency f and of size $S_i$ and $S_j$, respectively, where $S_i < S_j$, will not have the same impact on compressibility; whereas symbol i, if eliminated, would eliminate an amount of memory corresponding to $f \times S_i$, symbol j, when eliminated, would eliminate an amount of memory corresponding to $f \times S_j > f \times S_i$. Therefore, one inventive aspect can be seen as a process to create entropy-based encodings by sorting symbols based on the product between the size and the frequency of a symbol, denoted "removed slots" in FIG. 4, as shown in frequency table 420. For the sake of illustration, if all symbols listed in the frequency table would be removed, one would enjoy a compression ratio of 45/15=3 as opposed to 1.6 as of the example in FIG. 3.

This invention pertains to methods, devices and systems configured to sample, encode, compress, and decompress, respectively, symbols of variable size using entropy-based data compression principles which may be known per se in the prior art. Before describing how the disclosed embodiments of the invention deal with variable-sized symbols in the processes of sampling, encoding, compressing and decompressing a collection of data, the invention will first be described on a general level with reference to FIG. 15-19. Then, with reference to FIG. 5-6, we will describe how the examples of FIG. 1 and FIG. 2 may be extended into embodiments which allow entropy-based data compression and decompression methods to compress and decompress data in the memory and caches of the exemplary computer system in FIG. 1 and the data buffers in the communication system of FIG. 2, respectively. Finally, detailed exemplary embodiments of different parts and stages of the data compression and decompression methods and devices will be described with reference to FIG. 7-14.

Figure 15:
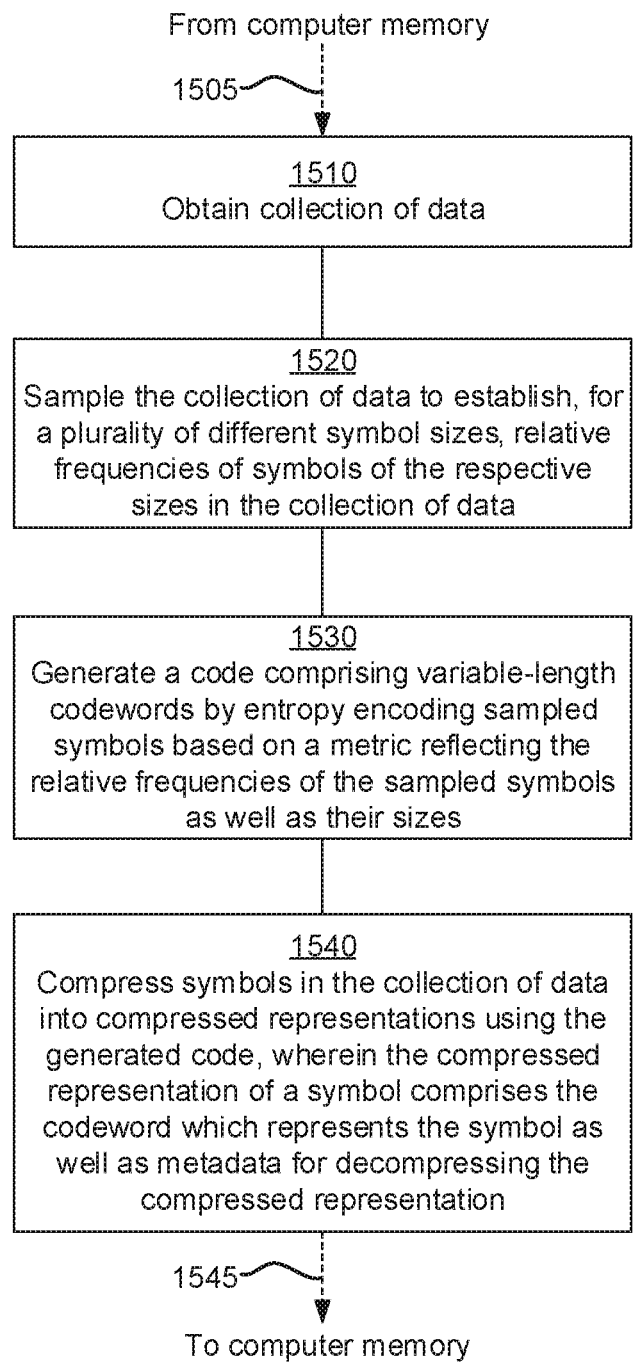
FIG. 15 depicts a general method for variable-sized symbol, entropy-based data compression according to the invention.
Figure 16:
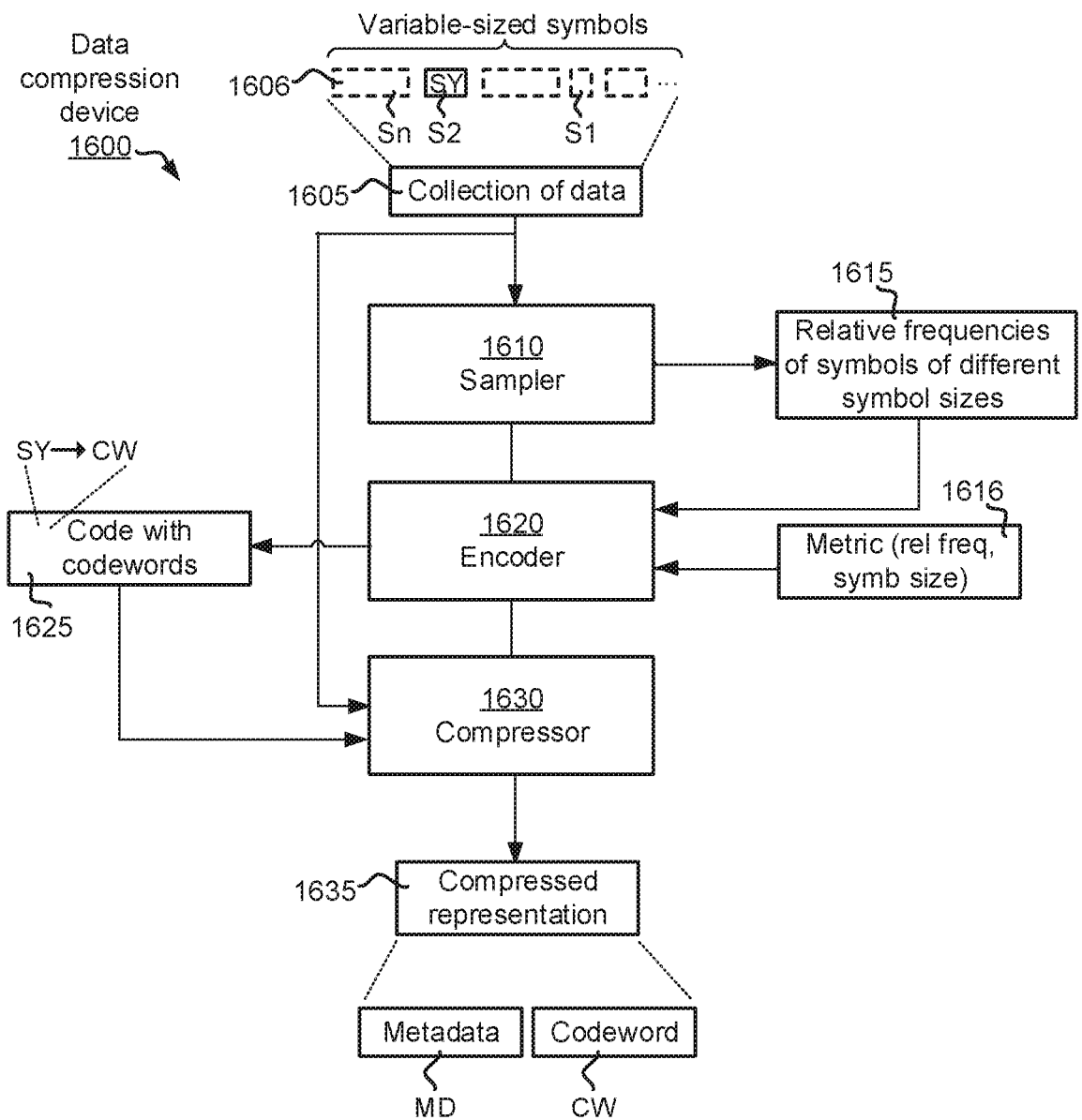
FIG. 16 depicts a general data compression device according to the invention.

FIG. 15 illustrates a general method for entropy-based data compression of variable-sized symbols according to the invention. Correspondingly, FIG. 16 illustrates a general data compression device 1600, capable of performing the data compression method of FIG. 15. FIGS. 15 and 16 will now be described concurrently. As seen at step 1510 in FIG. 15, the data compression device 1600 obtains a collection of data 1605 (FIG. 16). As is schematically indicated by an arrow 1505, this may typically involve reading the collection of data from a computer memory. Such a computer memory may, for instance, be an on-chip cache memory, an off-chip random access memory, a data buffer or a secondary data storage. Some non-limiting examples of such a computer memory are referred to as C1-C3; $M_1$-$M_k$; 610-650 in this document.

The obtained collection of data 1605 contains variable-sized symbols 1606, i.e. symbols of different symbol sizes S1-Sn. For instance, as seen in FIG. 16, symbol SY has the size S2.

As seen at step 1520, the obtained collection of data 1605 is sampled by a sampler 1610 to establish, for a plurality of (i.e. all or at least some of) the different symbol sizes S1-Sn, relative frequencies 1615 of the symbols 1606 of the respective sizes in the collection of data 1605.

Then, as seen at step 1530, an encoder 1620 operates on sampled symbols in the collection of data 1605 to generate a code 1625 comprising variable-length codewords. For instance, sampled symbol SY is represented in the code 1625 by a codeword CW, as seen in FIG. 16. The encoder 1620 generates the code 1625 by entropy encoding the sampled symbols in the collection of data 1605 based on a metric 1616 which reflects the relative frequencies 1615 of the sampled symbols as well as their sizes. In an advantageous embodiment, the metric 1616 may be calculated as probability of symbol occurrence×symbol weight, where probability of symbol occurrence=relative frequency of symbol/number of different symbols, and symbol weight=size of symbol/maximum symbol size. Depending on application, the metric may be calculated by the sampler 1610 or the encoder 1620.

As a next step 1540, a compressor 1630 compresses symbols in the collection of data 1605 into compressed representations using the generated code 1625. As seen in FIG. 16, the compressed representation 1635 of each compressed symbol comprises the codeword (for instance the codeword CW) which represents the symbol (i.e. the symbol SY) as well as metadata MD for decompressing the compressed representation 1635. In some embodiments which will be described in more detail later with reference to FIG. 7-14, the metadata MD may comprise a first portion 1151; V to indicate that the compressed representation 1635 of a symbol SY contains the codeword CW, and a second portion 1152; LEVEL to indicate a size of the symbol SY represented by the codeword CW.

As is schematically indicated by an arrow 1545 in FIG. 15, the compressed representations may typically be stored in a computer memory, such as for instance an on-chip cache memory, an off-chip random access memory, a data buffer or a secondary data storage. Again, some non-limiting examples of such a computer memory are referred to as C1-C3; $M_1$-$M_k$; 610-650 in this document. Depending on application, this computer memory may be the same as or different from the computer memory from which the collection of data 1605 was read according to arrow 1505 as described above.

The data compression device 1600 in FIG. 16 may be implemented in hardware, e.g. as digital circuitry in an integrated circuit, as a programmable processing device (e.g. a central processing unit (CPU) or digital signal processor (DSP), as a field-programmable gate array (FPGA), etc. The functionality of the data compression method in FIG. 15 may be performed by the data compression device 1600 being appropriately configured, or as a computer program product comprising code instructions which, when loaded and executed by a general-purpose processing device such as a CPU or DSP, cause performance of the method.

Even though the sampler 1610, encoder 1620 and compressor 1630 have been disclosed above with reference to FIG. 16 as being components of the data compression device 1600, it shall be noticed that in alternative embodiments, the sampler 1610, encoder 1620 and compressor 1630 may constitute separate devices. Also, two of the sampler 1610, encoder 1620 and compressor 1630 may together constitute a combined device, for instance the sampler 1610 and the encoder 1620, or the encoder 1620 and the compressor 1630.

Figure 17:
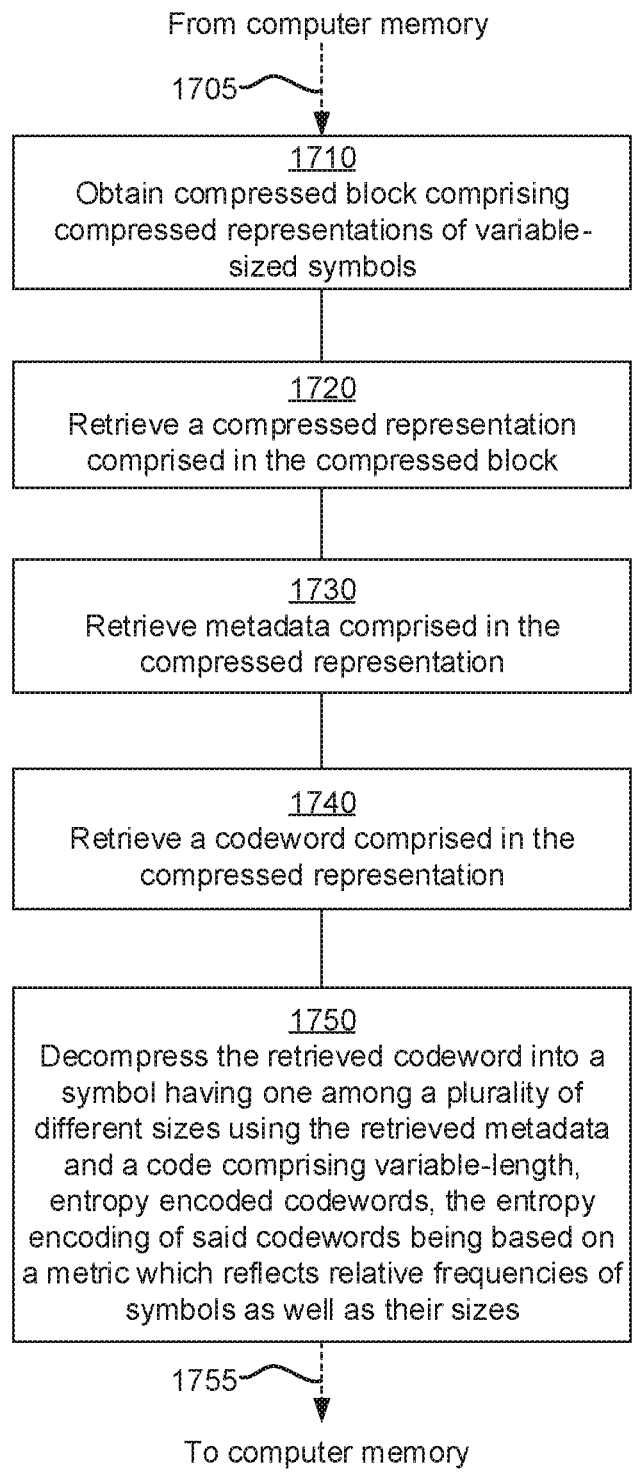
FIG. 17 depicts a general data decompression method according to the invention.
Figure 18:
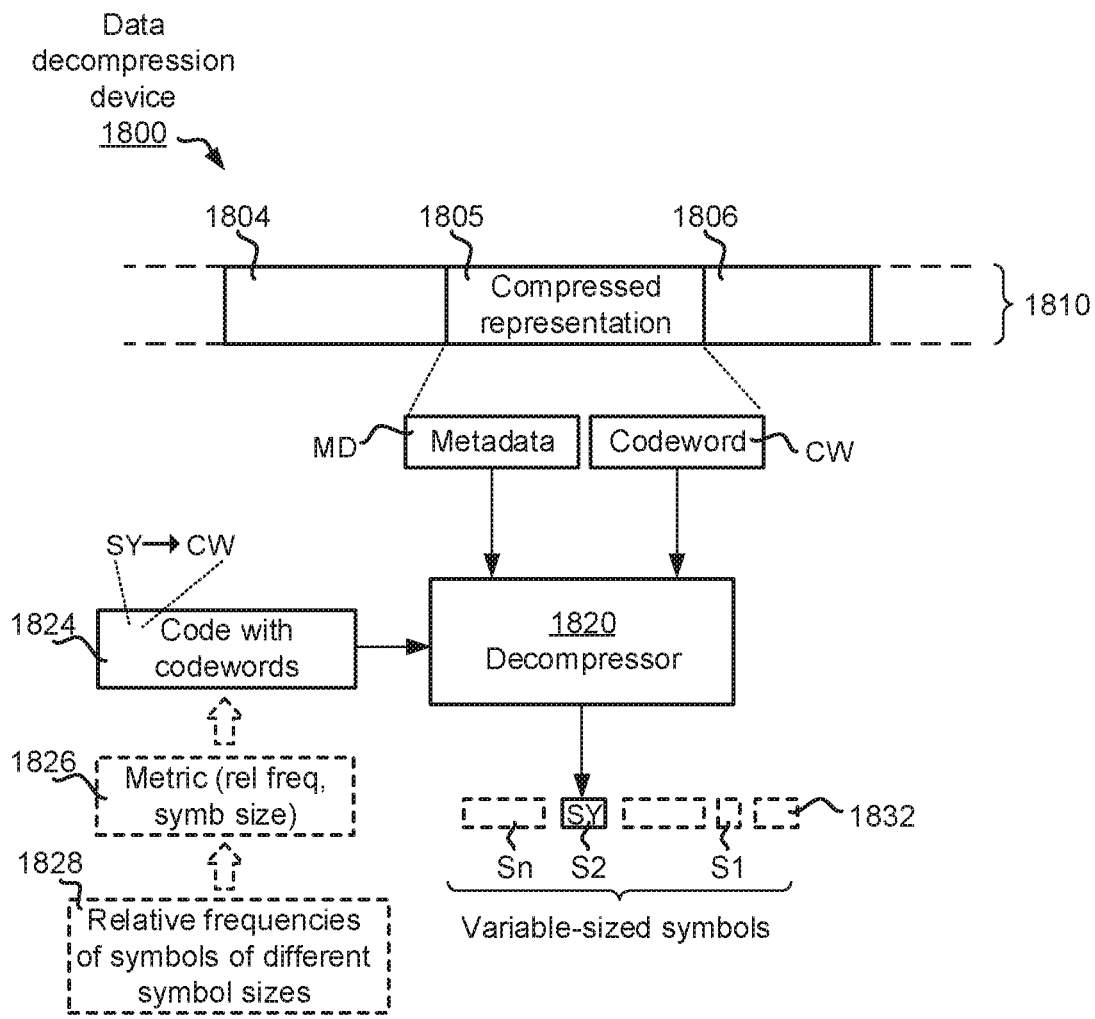
FIG. 18 depicts a general data decompression device according to the invention.

FIG. 17 illustrates a general data decompression method according to the invention. Correspondingly, FIG. 18 illustrates a general data decompression device 1800, capable of performing the data decompression method of FIG. 17. The data decompression device 1800 comprises a decompressor 1820. FIGS. 17 and 18 will now be described concurrently.

As seen at step 1710 in FIG. 17, the decompressor 1820 obtains a compressed block 1810 comprising compressed representations 1804, 1805, 1806 of variable-sized symbols 1832, wherein the compressed representations will have been generated by a data compression method and device 1600 as described above for FIGS. 15 and 16. The obtaining step 1710 may typically involve reading 1705 the compressed block from a computer memory of any of the types referred to above for FIGS. 15 and 16.

The decompressor 1820 retrieves (step 1720) a compressed representation 1805 comprised in the compressed block 1810, retrieves (step 1730) metadata MD comprised in the compressed representation 1805, and retrieves (step 1740) a codeword CW comprised in the compressed representation 1805.

Then, in a step 1750, the decompressor 1820 decompresses the retrieved codeword CW into a symbol SY having one among a plurality of different sizes S1-Sn. In doing this, the decompressor 1820 uses the retrieved metadata MD and a code 1824 comprising variable-length, entropy encoded codewords. The code 1824 will have been generated (as code 1625) by the encoder 1620 as described above with reference to FIG. 16. Hence, as is indicated schematically in FIG. 18, the entropy encoding of the codewords of the code 1824 has been based on a metric 1826 (i.e. metric 1616 in FIG. 16) which reflects relative frequencies 1828 of (original, uncompressed) symbols as well as their sizes. The metadata MD will allow the decompressor 1820 to decompress the compressed representation 1805, or more specifically the codeword CW comprised therein. As was mentioned above for FIGS. 15 and 16, in some embodiments which will be described in more detail later with reference to FIG. 7-14, the metadata MD may comprise a first portion 1151; V to indicate that the compressed representation 1635 of a symbol SY contains the codeword CW, and a second portion 1152; LEVEL to indicate a size of the symbol SY represented by the codeword CW.

As seen at 1755, the decompressed symbol SY may typically be stored in a computer memory of any of the types referred to above for FIGS. 15 and 16.

The data decompression device 1800 in FIG. 18 may be implemented in hardware, e.g. as digital circuitry in an integrated circuit, as a programmable processing device (e.g. a central processing unit (CPU) or digital signal processor (DSP), as a field-programmable gate array (FPGA), etc. The functionality of the data decompression method in FIG. 17 may be performed by the data decompression device 1800 being appropriately configured, or as a computer program product comprising code instructions which, when loaded and executed by a general-purpose processing device such as a CPU or DSP, cause performance of the method.

Figure 19:
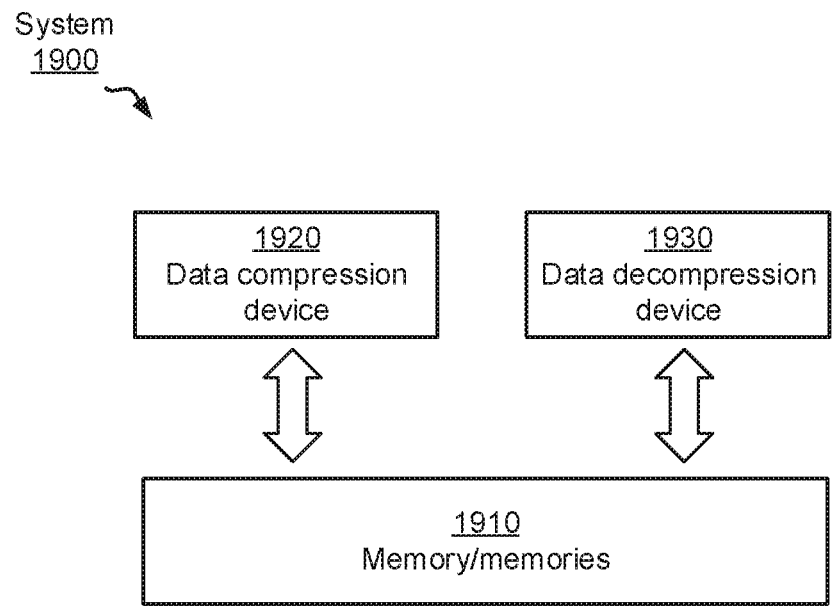
FIG. 19 depicts a general system comprising a data compression device and a data decompression device according to the invention.

FIG. 19 illustrates a general system 1900 according to the invention. The system comprises one or more memories 1910, a data compression device 1920 and a data decompression device 1930. Advantageously, the system 1900 is a computer system (such as the one which will be described as computer system 500 below with reference to FIG. 5), and said one or more memories 1910 is/are cache memory/memories (such as the cache memories C1-C3 referred to in other parts of this document), random access memory/memories (such as the memories $M_1$-$M_k$ referred to in other parts of this document), or secondary storage/storages. Alternatively, the system 1900 is a data communication system (such as the one which will be described as data communication system 600 below with reference to FIG. 6), and said one or more memories 1910 is/are data buffer(s) (such as the data buffers referred to as 610, 650).

Figure 5:
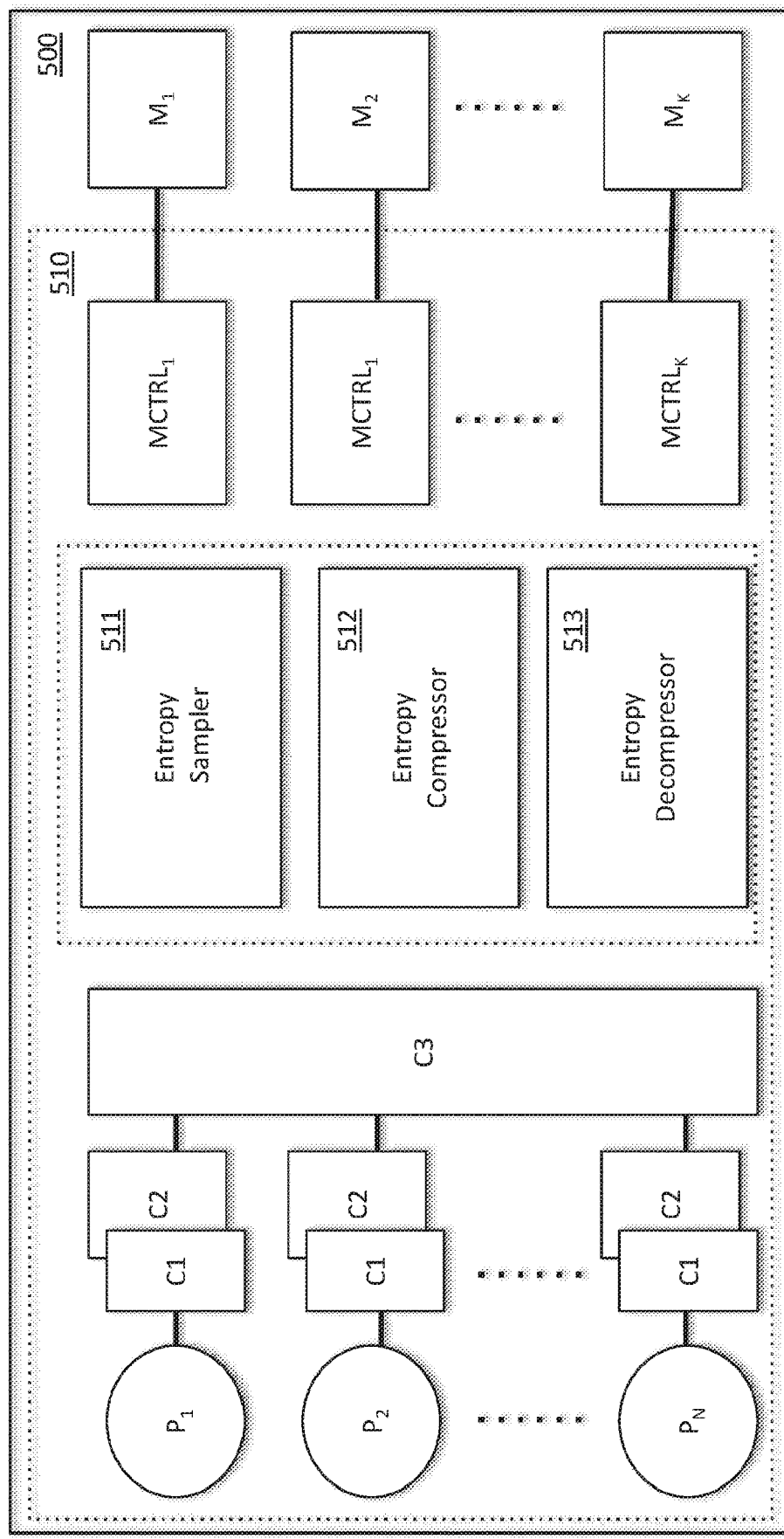
FIG. 5 depicts a computer system derived from FIG. 1 configured to 1) establish frequencies of symbols stored in the memories, 2) compress and 3) decompress the symbols.
Figure 6:
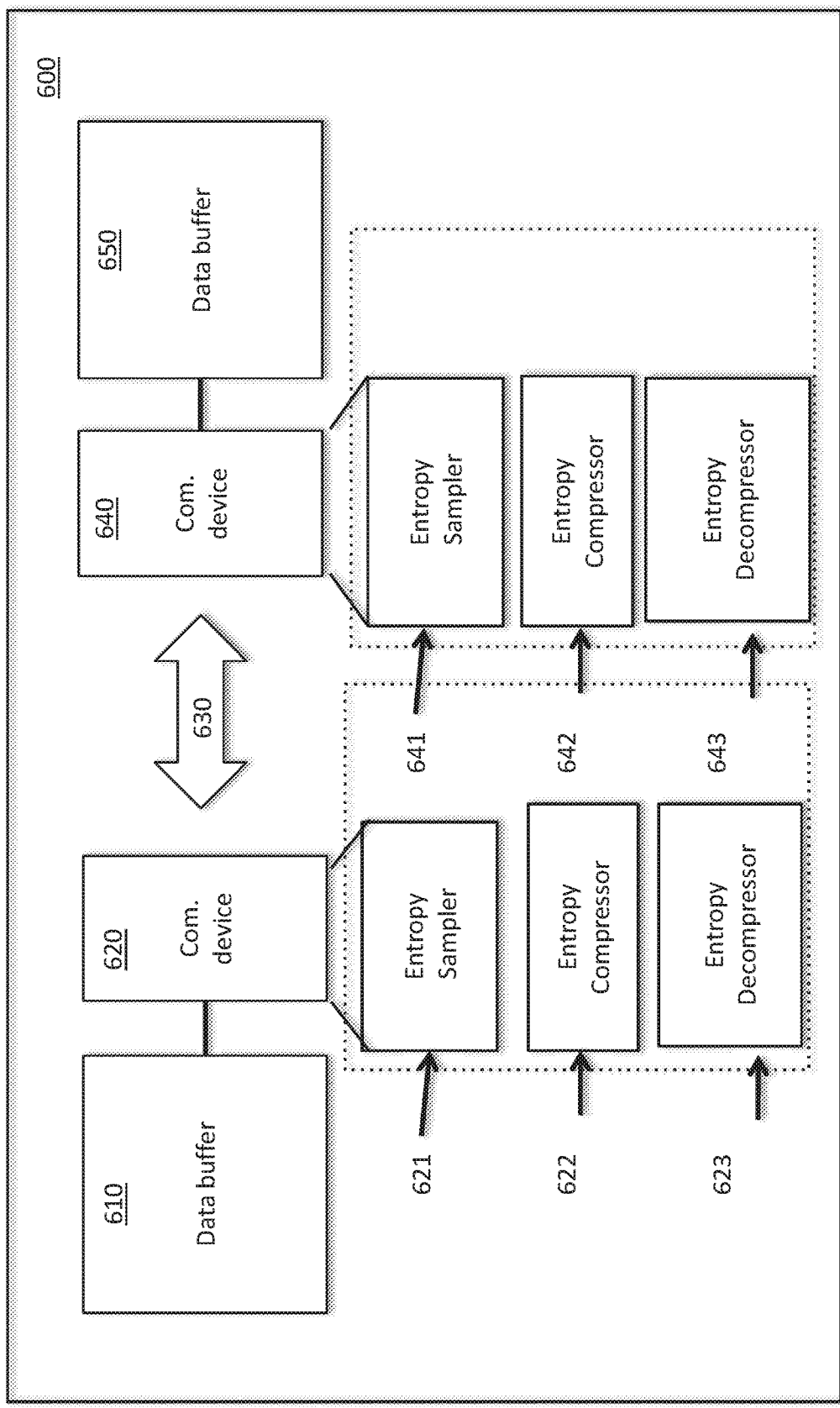
FIG. 6 depicts communication devices derived from FIG. 2 configured to 1) establish frequencies of symbols stored in the data buffers, 2) compress and 3) decompress the symbols to be transferred efficiently across the communication link.

With reference to FIG. 5-6, we will now describe how the examples of FIG. 1 and FIG. 2 may be extended into embodiments which allow entropy-based data compression methods to compress data in the memory and caches of the exemplary computer system in FIG. 1 and the data buffers in the communication system of FIG. 2, respectively. In FIG. 5, the computer system of FIG. 1 is revisited and has been extended with three new devices: one or a plurality of entropy samplers 511, one or a plurality of entropy compressors 512 and one or a plurality of entropy decompressors 513. Someone skilled in the art will appreciate alternative embodiments as explained earlier in the context of FIG. 1. The purpose of the entropy sampler 511 is to implement the sampler 1610 of FIG. 16, i.e. to establish the frequency of symbols in a memory area located in one or a plurality of memory modules $M_1$ through $M_K$ or in one or a plurality of cache levels C1 through C3 and as described later. The purpose of the entropy compressor 512 is to implement the compressor 1630 of FIG. 16, i.e. to compress a collection of data stored in any of the aforementioned memory locales based on an entropy-based encoding, as will be described in detail later. The entropy-based encoding may be established by an entropy encoder which will implement the encoder 1620 in FIG. 16 but which is however not shown in FIG. 5. The entropy sampler 511, entropy encoder and entropy compressor 512 may thus jointly implement the data compression device 1600 in FIG. 16.

The purpose of the entropy decompressor 513 is to implement the decompressor 1820 (or the entire data decompression device 1800) in FIG. 18, i.e. to decompress a collection of data stored in any of the aforementioned memory locales, for example a cache or a main memory device, using an entropy-based encoding, as will be described in detail later.

In FIG. 6, we revisit an exemplary organization of a communications system including two computerized systems with the ability to communicate over a communication link 230 according to FIG. 2. Communication devices 620 and 640 have been extended with an entropy sampler (621 and 641), an entropy compressor (622 and 642) and an entropy decompressor (623 and 643). Someone skilled in the art can appreciate alternative embodiments as explained earlier in the context of FIG. 2. Like the embodiment in FIG. 5, the purpose of the entropy sampler (621 and 641, respectively) is to implement the sampler 1610 of FIG. 16, i.e. to establish the frequency of occurrence of symbols in a data buffer (610 and 650, respectively) as will be described in detail later. The purpose of the entropy compressor (622 and 642, respectively) is to implement the compressor 1630 of FIG. 16, i.e. to compress a collection of data in a data buffer (610 and 650, respectively) based on an entropy encoding, as will be described later. The entropy-based encoding may be established by an entropy encoder which will implement the encoder 1620 in FIG. 16 but which is however not shown in FIG. 6. The entropy sampler 621/641, entropy encoder and entropy compressor 622/642 may thus jointly implement the data compression device 1600 in FIG. 16.

The purpose of the entropy decompressor (623 and 643, respectively) is to implement the decompressor 1820 (or the entire data decompression device 1800) in FIG. 18, i.e. to decompress a collection of data stored in a data buffer (610 and 650, respectively) using an entropy-based encoding, as will be described in detail later.

With reference to FIG. 7-14, detailed exemplary embodiments of different parts and stages of the inventive data compression and decompression methods and devices will now be described.

Figure 7:
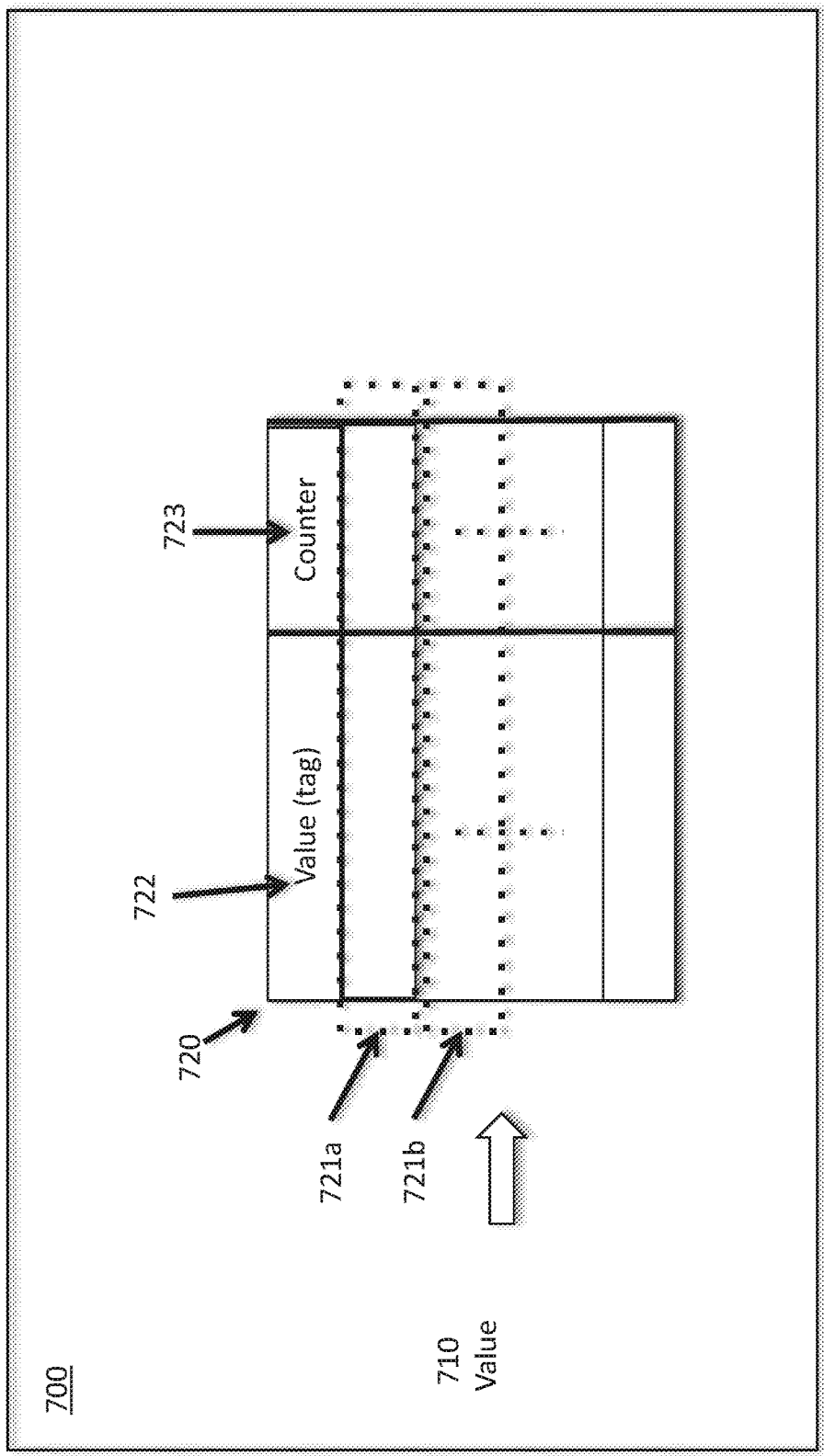
FIG. 7 depicts a value frequency table (VFT) to establish the frequencies of fixed-sized symbols to be used to form entropy-based encodings of symbols of a fixed size.

Let us now describe the working of the sampler 1610 as implemented by the entropy sampler in the context of FIG. 5. Recall that the purpose of the sampler is to establish the frequency of fixed-sized symbols in a memory or cache area. Assuming for the sake of illustration that a symbol is, say, a 32-bit value stored in an area in computer memory, say, in any of the memory modules $M_1$ through $M_K$ of FIG. 5, or, alternatively, in one or a plurality of cache memory levels, say C3, the sampler will visit all 32-bit values of said area to count their frequency of occurrence so as to establish the absolute frequency of all the symbols. For this purpose, FIG. 7 shows a value-frequency table 700 (abbreviated VFT). The VFT is organized as an ordinary cache with one or a plurality of entries (for example 721a and 721b). Unlike an ordinary cache that comprises a tag store and a value store, a VFT comprises a tag store 722 and a counter store 723 and the tag store is indexed by a symbol (or its value). As with ordinary caches, VFTs can employ a number of address mapping strategies such as direct-mapped, set-associative or fully associative. VFTs can also consider a number of replacement strategies such as LRU (Least Recently Used), LFU (Least Frequently Used) or other known strategies from prior art as can be appreciated by someone skilled in the art. The operation of a VFT is as follows. For each fixed-sized symbol in the considered memory area, indexing the VFT with a value 710 corresponding to the symbol does a VFT look-up. On a VFT look-up, and depending on the address mapping mechanism employed, one or several entries are considered and the value is matched against the tags of the selected entries. On a tag match, called hit, the corresponding counter is incremented unless it has reached its maximum number. If no tag matches, called miss, the new symbol is inserted and the corresponding counter is set to 1. To insert a new symbol, one may have to evict another symbol. The symbol selected for eviction can be decided based on any known replacement strategy from prior art as described earlier. The process of counting the frequencies of all symbols in a memory area is repeated until all symbols have been encountered. Note that the VFT of FIG. 7 assumes symbols of a fixed size determined at design time. We will later describe a sampler with a VFT extended to deal with symbols of variable size.

The symbol frequencies established in the sampling process, as explained in the previous paragraph, can be used by an entropy-based data compression method to determine symbol codes whose lengths are optimal according to Shannon's source coding theory. We illustrate this, by way of example, considering the canonical Huffman method next. Assuming eight fixed-size symbols "A", "B", "C", "D", "E", "F", "G" and "H" with probabilities (i.e. frequency/number of symbols) 0.05, 0.05, 0.05, 0.1, 0.15, 0.15, 0.2, 0.25 respectively, the Huffman algorithm can generate the lengths of the codewords associated with these values: 4, 4, 4, 4, 3, 3, 2 and 2, respectively. The code construction algorithm will start from the most frequent one, from the right in the example and going to the left. Therefore, the exemplary symbol "H" will be assigned to the canonical codeword "00" whose numerical value is 0 represented by 2 bits as its codeword length is 2. Symbol "G" will then be assigned to "01". Symbol "F" will be replaced by a codeword of 3 bits. Since the last assigned code-word value is "01" to symbol "G", symbol "F" will be assigned to the next numerical value, that is codeword "10" shifted by one bit to the left "100", in order to be represented by 3 bits as the code length determines. In a similar way, the canonical Huffman codewords for the above values are constructed and are respectively "1111", "1110", "1101", "1100", "101", "100", "01", "00". While this is one way of generating canonical Huffman codewords, as anyone skilled in the art will appreciate, there are alternative ways of generating canonical Huffman codewords depending on the codeword length that the code generation algorithm starts with. Note that a process as the one outlined assumes that all symbols have a fixed size and cannot deal with symbols of variable size.

Figure 8:
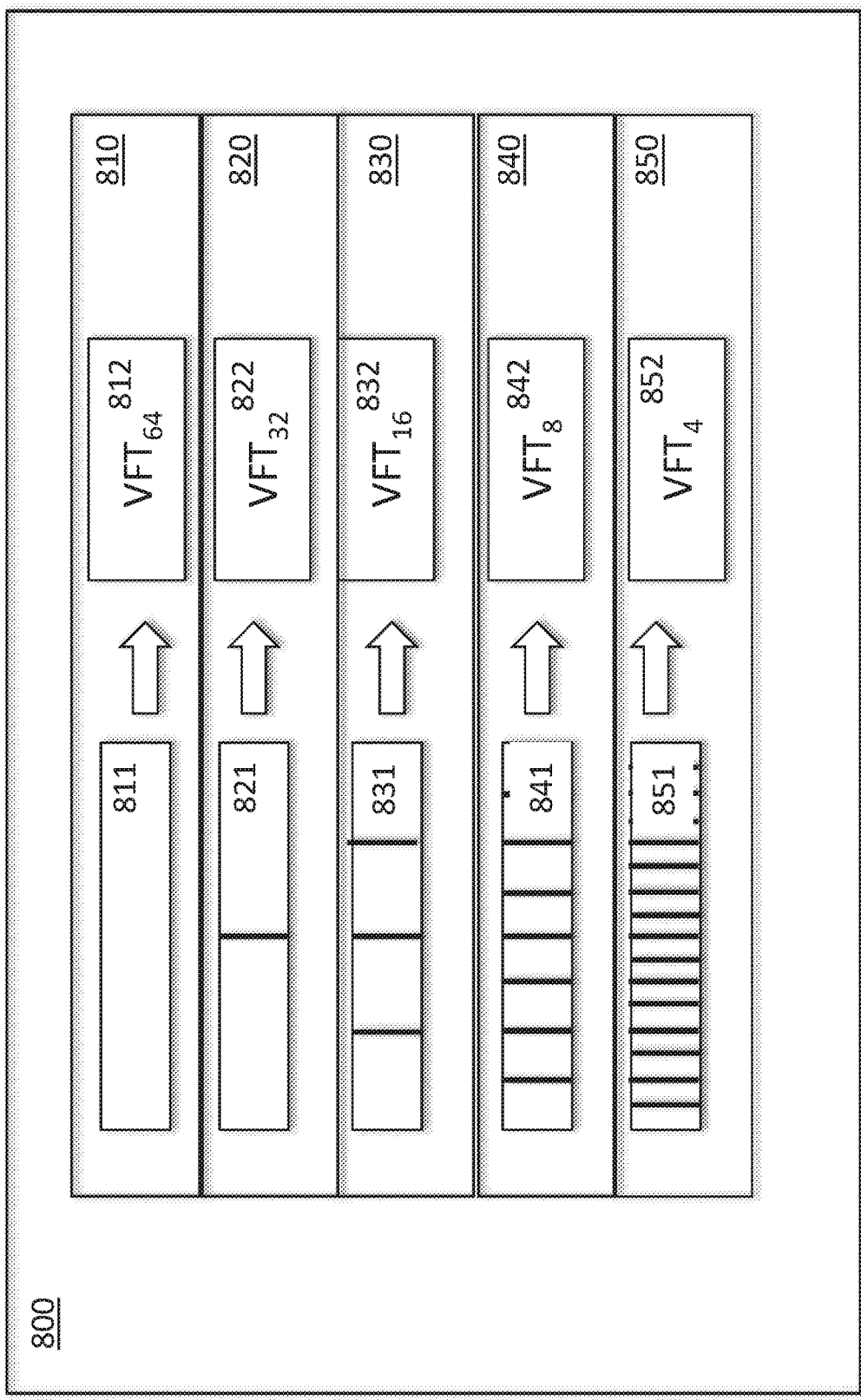
FIG. 8 depicts a collection of value frequency tables to establish the frequencies of variable-sized symbols to form entropy-based encodings of such symbols.

We now describe the working of an entropy sampler 800 (implementing the sampler 1610 in FIG. 16 as one possible embodiment thereof) that captures the value frequency of variable-sized symbols as shown in FIG. 8. For the sake of illustration, we assume that sampling is carried out based on a collection of data in a memory area of consecutive locations, where each location can store a single byte. The sampler 800 comprises a plurality of parallel sampler units 812-852. Each sampler unit is configured to establish the relative frequency of occurrence of symbols of a respective one of the aforementioned plurality of different symbol sizes S1-Sn. Without loss of generality, and for the ease of explanation, we exemplary assume that symbols can take one of five different symbol sizes S1-S5: 4 bytes, 8 bytes, 16 bytes, 32 bytes and 64 bytes. The exemplary variable-sized symbol sampler 800 of FIG. 8 hence comprises five parallel sampler units 812-852 with an organization according to FIG. 7, where each is configured to count the frequency of occurrence of symbols of a respective fixed symbol size. Accordingly, the sampler 800 of FIG. 8 comprises the five sampler units 812-852 which are also denoted $VFT_4$, $VFT_8$, $VFT_{16}$, $VFT_{32}$, and $VFT_{64}$, corresponding to symbols of size 4 bytes, 8 bytes, 16 bytes, 32 bytes and 64 bytes, respectively. The process of determining the frequency of occurrence of variable-sized symbols starts with copying a block of 64-byte data from the selected memory area into all of the buffers 811, 821, 831, 841 and 851. Referring back to the VFT of FIG. 7 and assuming, without loss of generality, a fully associative VFT organization, the tag store of $VFT_{64}$ is used to match against 64-byte symbols whereas the tag store of $VFT_4$ is used to match against 4-byte symbols. Hence, whereas only a single matching operation is needed in the case of $VFT_{64}$, as many as 16 matching operations are needed in the case of $VFT_4$. The process of evaluating a 64-byte memory block involves 16 matching operations in $VFT_4$, 8 matching operations in $VFT_8$, four matching operations in $VFT_{16}$, two matching operations in $VFT_{32}$ and one matching operation in $VFT_{64}$. This process is repeated for the entire selected memory area. In order for the content of the VFTs to be processed further, to determine the encoding, the counters in the VFTs can be memory mapped so that their content can be examined by software routines. In alternative embodiments, hardware accelerators can be configured to process the contents of the counters so as to establish entropy-based encodings.

The symbol frequencies established in the sampling process can be used by an entropy-based data compression method to generate codes. We illustrate this, by way of example, considering the canonical Huffman method next. Assuming the four symbols "GHIJKLMN", "CDEF", "BC" and "A" occur with a probability (i.e. frequency/number of symbols) of 0.15, 0.15, 0.2, 0.25 respectively, the canonical Huffman algorithm will generate the lengths of the codewords associated with these values: 3, 3, 2 and 2, respectively. However, entropy-based encoding methods in prior art assume that all symbols have the same size. This can yield substantially lower compressibility than if variable-sized symbols are considered. As an example, the coding of the longest symbol, i.e., "GHIJKLMN" will have a higher impact on compressibility than the coding of the shortest symbol, i.e., "A". One embodiment of the disclosed invention first sorts symbols in ascending order based on the removed-slot metric defined as the product of the probability of symbol occurrence and symbol weight, where symbol weight is defined as the size of a symbol divided by the maximum size of a symbol. In the example, the removed-slot metric for the aforementioned exemplary list of symbols is 0.15×8/8, 0.15×4/8, 0.2×2/8, 0.25×1/8 leading to 0.15, 0.075, 0.05, and 0.03, respectively. Hence the assignment of codes to symbols in the example would be reversed as compared to entropy-based encoding schemes of prior art that assume all symbols have the same size.

The above process assumes that a symbol of one size is not included in a symbol of another larger size. To account for inclusion, it is proposed that the above process first removes a first symbol of one size included in a second symbol of a larger size to calculate a metric of occurrence of a first symbol. In this process, the symbol frequency of a first symbol is adjusted to account for its occurrence in a second symbol of a larger size. An exemplary system configured to implement this process and an exemplary logic to accomplish the result of such a process is described in FIG. 9.

Figure 9:
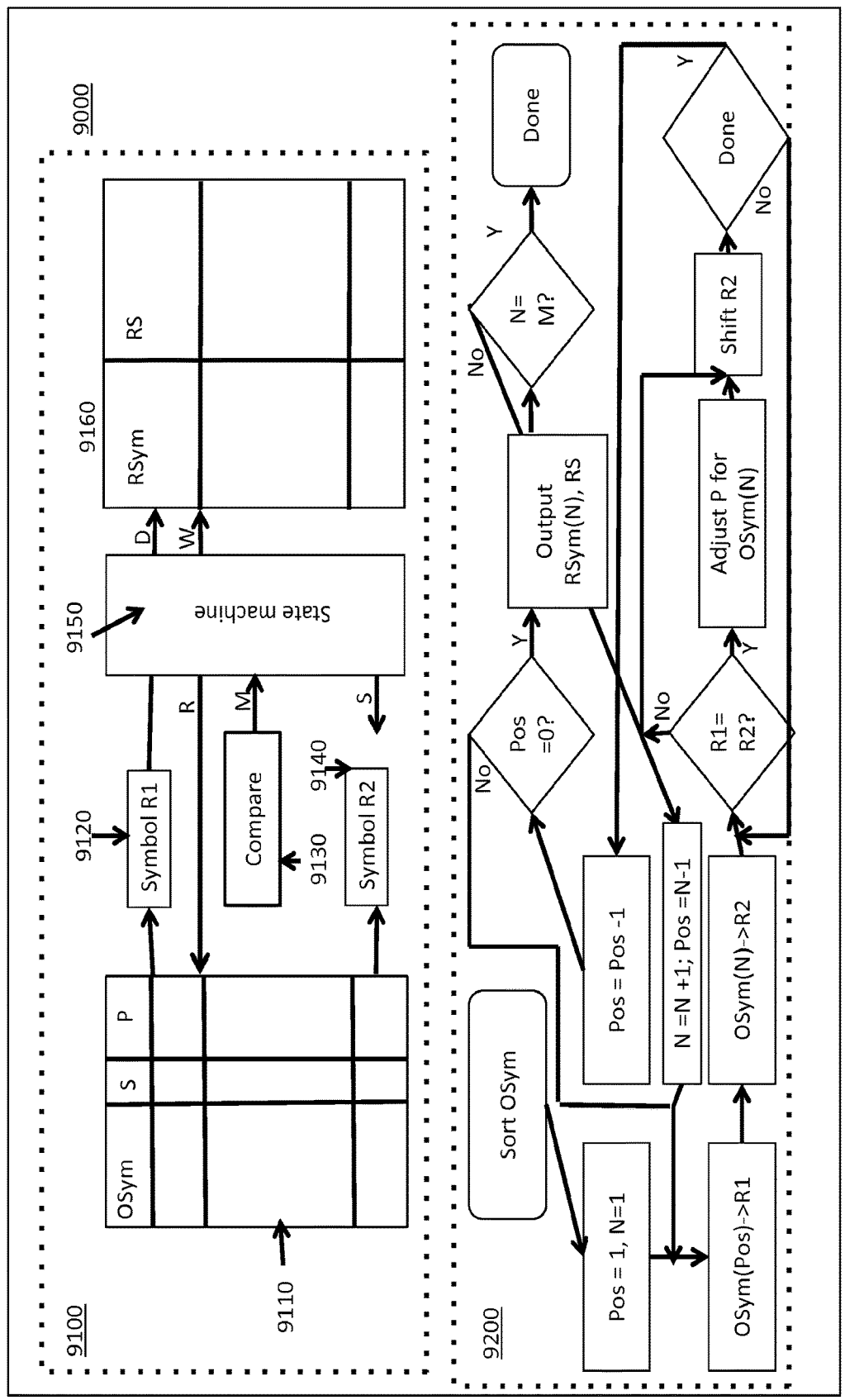
FIG. 9 depicts a system configured to and a flowchart describing the process of establishing entropy-based encodings for variable-sized symbols.

FIG. 9 illustrates a system 9100 configured to take as input variable-sized symbols, referred to as "Original Symbols—denoted OSym, exemplary stored in a memory 9110, each comprising attributes for their size, denoted "S", and probability of occurrence, denoted "P", determined in the sampling process described above. The exemplary system 9100 is configured to generate the content of a memory of "Resulting Symbols"—denoted Rsym, exemplary stored in a memory 9160, where each entry is comprising attributes of "Removed slots"—denoted RS, as defined in detail above. As will be described in detail below, the exemplary system 9100 additionally comprises a state machine 9150 that can analyze each entry in memory 9110 comprising an OSym to output its corresponding RS to the memory 9160. The state machine 9150 can be configured to access any entry in memory 9110 and 9160. Specifically, it can move the content of an entry in memory 9110 to a register 9120, denoted Symbol R1 or to a register 9140 by comprising relevant signals to access memory 9110, for example a read signal R in FIG. 9 that comprises an address to memory 9110 and reference to any of the aforementioned registers 9120 or 9140. Furthermore, and which will become apparent in the description to follow, state machine 9150 can also shift the content of register 9140 by an amount that corresponds to the size "S" of that register, as specified above, of a symbol being examined. Finally, the exemplary system 9100 comprises a comparator 9130 that takes as input a symbol stored in register R1 9120 and a portion, dictated by a size attribute "S", provided by state machine 9150. The result of the comparison is reflected by a signal denoted "M" for match. For example, if there is a match, "M" is set. Conversely, if there is no match, "M" is cleared.

Assuming an exemplary system 9100, let us turn our attention to an exemplary logic of a process implemented by the state machine 9150. This logic is described in the process diagram 9200. The first step is to sort the original symbols, denoted OSym, in memory 9110 in the order of size, denoted "S" with, in this example embodiment, a symbol of the largest size appearing at the top corresponding to the entry N=1. Someone skilled in the art can realize how to configure a system to accomplish such a task. For reasons to be explained below, the logic may also consider other symbols at an entry Pos, initially set to Pos=1. Following the flow of the process, state machine 9150 moves symbols appearing in entries Pos and N to register R1 and R2, respectively. The comparator 9130 of the state machine 9150 then compares the content of registers R1 and R2 based on the size attribute associated with register R2 and as dictated by signal "S" of system 9100. If there is a match, the probability "P" of the symbol presently available in register R2 is adjusted taking into account the probability "P" of the symbol presently available from register R1. This operation is represented by the box denoted "Adjust P for OSym(N)." If there is no match, i.e. "M" is cleared, this operation is skipped. Regardless of the outcome, the next step is to shift the content of R2 by an amount that corresponds to the size "S" of the symbol stored in R2.

In the exemplary system 9100, the comparison aims at determining whether there is a match between a portion of a first symbol of one size S1 and a second symbol of another, smaller size S2. The exemplary process to carry out that comparison will match a second symbol with all parts of a first symbol that matches the size of a second symbol. To this end, state machine 9150 can shift the content of the symbol of size S2 in R2 to match all parts of the symbol of size S1 in R1. This is accomplished by shifting the content of R2 with an amount dictated by "S" output from state machine 9150 and carried out in the box in 9200 denoted "Shift R2". The decision box "DONE" can then decide whether all portions of register 9120 have been matched, denoted "Y", or if additional portions must be compared, denoted "No". If the outcome is the latter, a new comparison between R1 and R2 is carried out until all portions have been compared.

When all portions of R1 have been compared, the content of register R2 9140 is compared to the next larger symbol as denoted by the flow following "Y" in the decision box denoted "Done". This is defined by the entry associated by the logical variable "Pos", initially set to 1. As shown in the flow following the arrow from "Y" in the decision box denoted "Done", Pos is decremented. The decision box "Pos=0" determines whether the current symbol stored in register 9140 has been compared to all portions of register R1 9120. If so, denoted "Y", the symbol and its adjusted "Removed slots", denoted RS, is output to memory 9160. The decision box "N=M?" then determines whether all symbols in memory 9160 have been examined. If so, denoted "Y", the process terminates. If not, denoted "No", the process continues with the box "N=N+1; Pos=N−1" aiming at considering the next symbol at entry N in memory 9110 and starting with comparing it with a symbol at a next larger size stored in position Pos=N−1 in memory 9110.

Someone skilled in the art can realize that system 9100 and the logic 9200 controlling that system can be realized also by an ordinary computer configured by a program to carry out a process exemplified by process 9200 configuring memory and registers in said computer to implement the system 9100 needed to carry out the process 9200. Other embodiments appreciated by someone skilled in the art may consider some parts implemented in hardware to gain efficiency and some parts in software by means of a program that may not be critical to efficiency in carrying out the task.

The exemplary system and process of FIG. 9 can establish an encoding of variable-sized symbols, i.e. implement the encoder 1620 in FIG. 16 as one possible embodiment thereof. As explained above, the encoder 1620 is hence configured to compensate for a first symbol of a smaller symbol size Sx being included in a second symbol of a larger symbol size Sy, where Sx<Sy, such that the occurrence of said first symbol is accounted for in the relative frequency established for the larger symbol size but not in the relative frequency established for the smaller symbol size.

Figure 10:
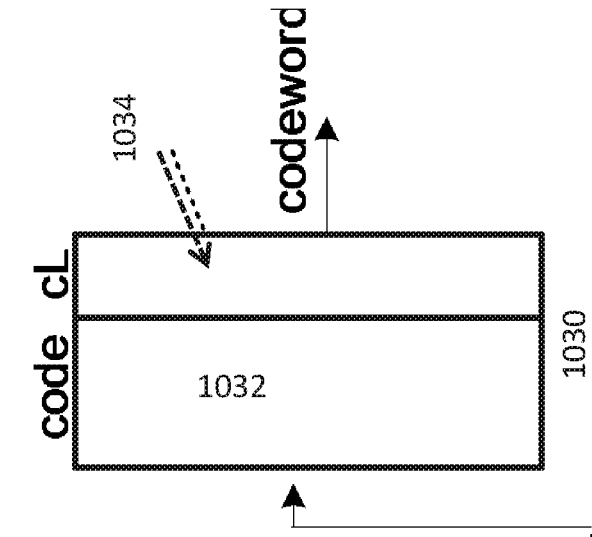
FIG. 10 depicts a Huffman compressor (HuC) to compress fixed-sized symbols.
Figure 10:
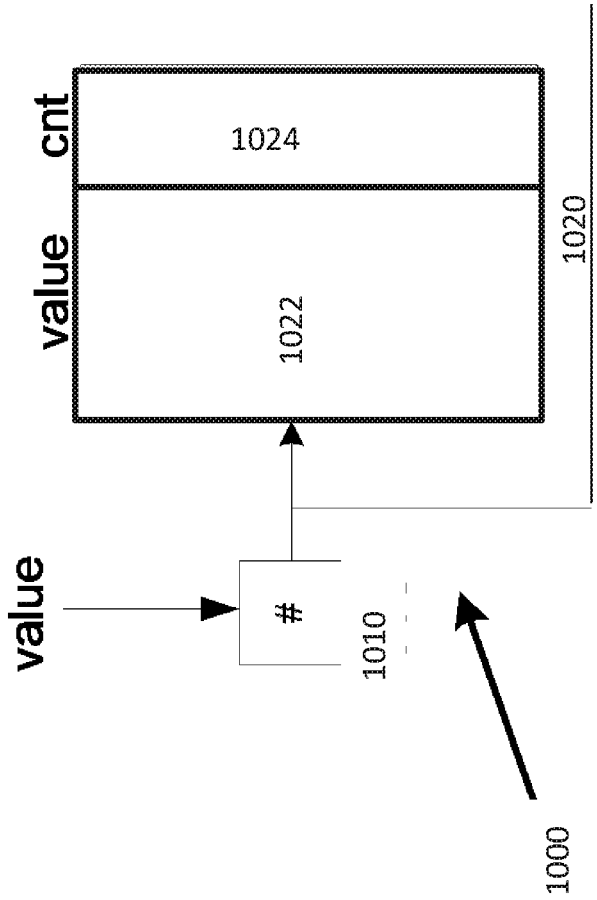

Once the encoding has been established, we now turn our attention to the working of an entropy compressor first assuming one that deals with fixed-sized symbols. FIG. 10 depicts an embodiment 1000 of an exemplary Huffman Compression Mechanism for fixed-size symbols. The exemplary compressor 1000 comprises a Value Table (VT) 1020. The VT 1020 saves the values of the symbols to be compressed 1022 and their frequency of occurrence using the counter 1024. The compressor 1000 also comprises a Code Table (CT) 1030 which stores the generated codewords which make up the aforementioned code 1625. In fact the VT is part of the compression mechanism 1000 because both VT 1020 and CT 1030 are indexed using the address association mechanism 1010 that matches an input value corresponding to a symbol with a codeword, and the VT 1020 verifies that a particular symbol exists in the Value Table and, hence, a valid codeword exists in the Code Table. The association function in the compression mechanism 1010 can be implemented as a hash function, but someone skilled in the art can consider alternative implementations.

Figure 11:
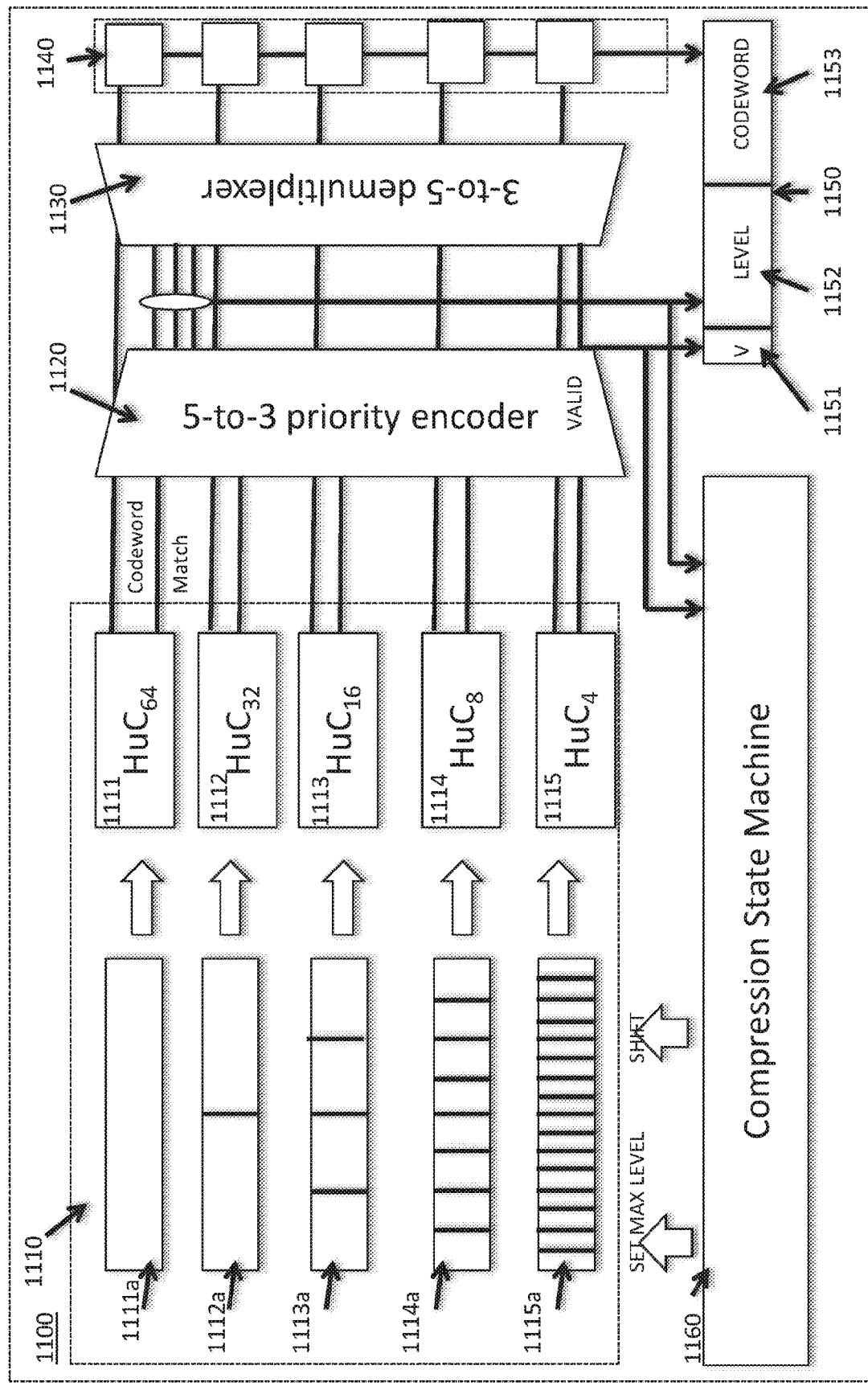
FIG. 11 depicts a Huffman compressor (mHuC) to compress variable-sized symbols.

We now use the exemplary compression mechanism described in the previous paragraph to describe the working of an entropy compression mechanism, without loss of generality exemplified by a Huffman-based compressor that can operate on variable-sized symbols. One embodiment of such an entropy compressor is shown in FIG. 11. The exemplary compressor 1100, which implements the compressor 1630 in FIG. 16 as one possible embodiment thereof, comprises a plurality of Huffman compressor units 1111-1115, each being designed generally as the compressor 1000 in FIG. 10. Generally, the compressor 1100 comprises a plurality of parallel compressor units 1111-1115 adapted to receive a common data block 1111a-1115a from the aforementioned collection of data 1510. Each compressor unit 1111-1115 is configured to identify in said common data block a matching symbol of a respective one of said plurality of different symbol sizes S1-Sn. The compressor 1100 is configured to output a codeword corresponding to a symbol having the largest symbol size among matching symbols identified by the compressor units 1111-1115.

In the embodiment disclosed in FIG. 11, five symbol sizes are considered: 4 bytes, 8 bytes, 16 bytes, 32 bytes and 64 bytes and correspondingly there are five compressor units denoted $HuC_4$ 1115, $HuC_8$ 1114, $HuC_{16}$ 1113, $HuC_{32}$ 1112 and $HuC_{64}$ 1111, respectively. There is a 64-byte register 1111a, 1112a, ..., 1115a associated with each compressor unit 1111-1115. The process of compressing a 64-byte block of data starts with loading that common data block into all five 64-byte registers that feed into the compressor units. Conceptually, and as will be described in detail later, the overall process to compress a 64-byte block is to always consider variable-sized symbols starting with the largest symbol and then considering smaller symbols if no match is found for a larger-sized symbol. Comparison of symbols of different sizes is carried out in parallel. For this reason, each compressor unit outputs a signal, denoted Match, and a codeword. All Match signals constitute input to a 5-to-3 priority encoder 1120 that outputs the highest encoded level at which a match is detected. For example, assuming that there is a match at level 0 ($HuC_4$) and level 2 ($HuC_{16}$), the priority encoder 1120 would output 010 corresponding to level 2. The codewords of the matched levels are fed into a plurality of tri-state buffers 1140; five in the exemplary compressor. On a match at any level, a 3-5 demultiplexer, whose input is the encoded level, will activate the corresponding tri-state buffer to output the codeword of that level. On a match, the corresponding codeword along with metadata is also fed into a register 1150 comprising three parts: a valid (V) bit 1151, a level 1152 and a codeword 1153, wherein the valid bit 1151 and the level 1152 constitutes the metadata MD as referred to in the description above of FIG. 15-18. The V bit designates that the information that follows is a compressed symbol. The level designates the size of the (uncompressed) symbol and the codeword is the compressed symbol according to the entropy-based data compression method of choice. If there is no match, the valid bit is cleared. This means that there is no match at any level so the symbol of the smallest size is output, uncompressed, and the level information is not relevant. In the case of all 4-byte symbols in a 64-byte block of data cannot be compressed, one could encode the entire block as not compressed at the level of 64 bytes, as an optimization. Someone skilled in the art can appreciate how the working of the variable-sized symbol compressor can be extended to incorporate such and other optimizations.

We have so far made an overall description of the approach taken to deal with a symbol match or no match at each of the levels. The exemplary state machine 1160 is configured to control the compression process and the underlying process of its working is described in the flow chart described in FIG. 12. Referring again to FIG. 11, the state machine takes as input a Valid signal flagging whether there is a match at any level and the encoding of the level of a match. The state machine output comprises a set of shift signals (SHIFT) that can control each of the five input registers connected as input to the five compressors: $HuC_4$ 1115, $HuC_8$ 1114, $HuC_{16}$ 1113, $HuC_{32}$ 1112 and $HuC_{64}$ 1111. For example, while the input register at level 0 and connected to $HuC_4$ can be shifted by 4 bytes, the input register at level 3 can be shifted by 32 bytes. Finally, the state machine can also control which levels should be tested for matching by masking levels higher than a preset value. For example, if SET MAX LEVEL is set to three, only the compressors associated with level 0, 1, 2 and 3 are considered for matching.

Figure 12:
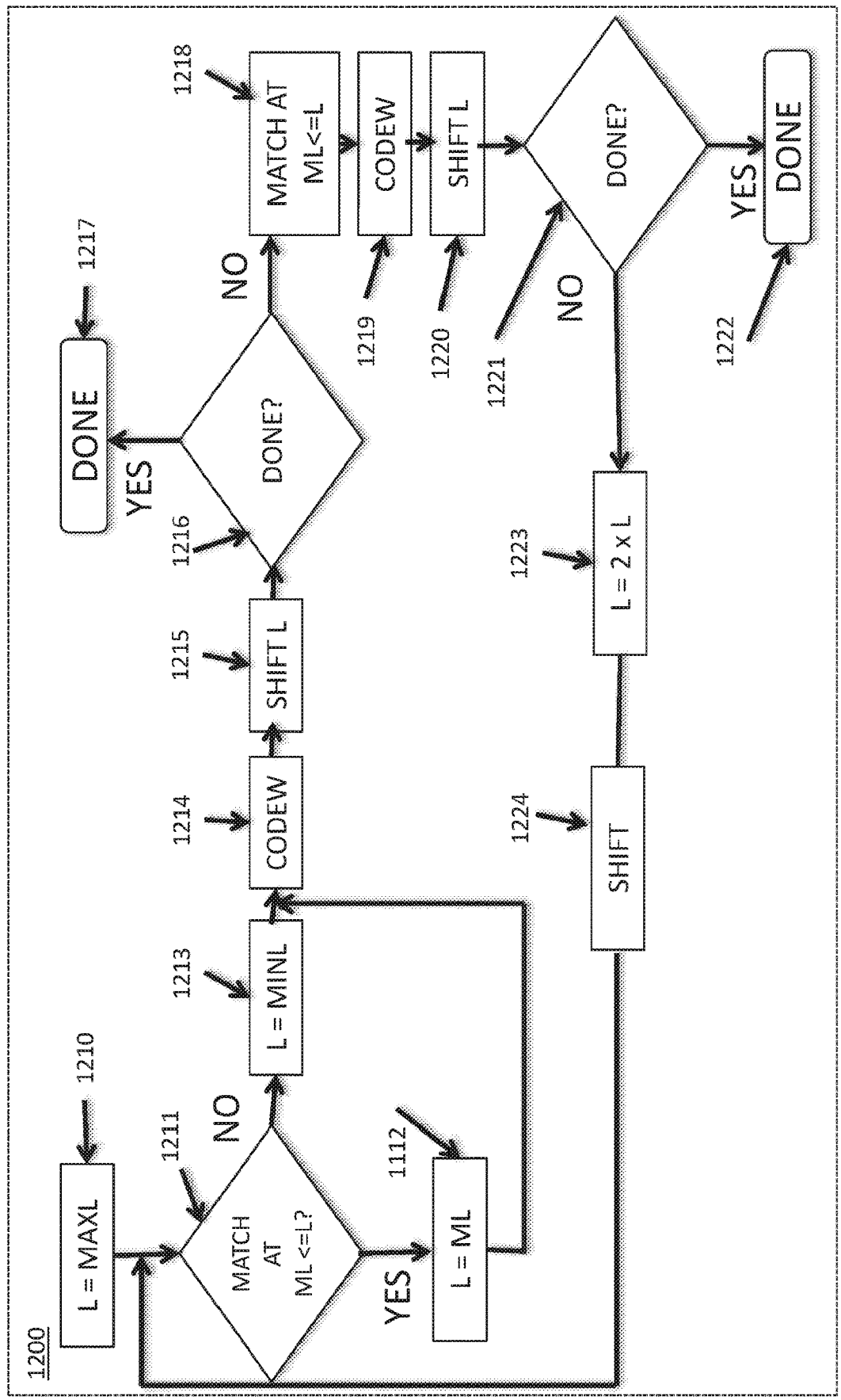
FIG. 12 depicts a flowchart for a state machine controlling an exemplary Huffman compression process of variable-sized symbols.

Let us now turn our attention to the exemplary flow chart 1200 of FIG. 12. The process starts by setting the level to MAXL, the maximum level for the test, which is five in the exemplary compressor of FIG. 11. In the decision box 1211 the state machine outputs SET MAX LEVEL=5, which enables a test including all compressors. If there is a match at any level, the maximum level ML is chosen (L=ML 1212) and the codeword is output (CODEW 1214). On the other hand, if there is no match at any level, the level is set to the minimum one (L=MINL 1213) and the corresponding (uncompressed) symbol is output (CODEW 1214). Next, the input registers at the level of a match or lower, and in the limit MINL, are shifted an amount corresponding to the level at which a match occurred, or if no match occurred, MINL. The decision box 1216 decides whether all of the symbols in the 64-byte block have been tested, in which case the process terminates. If not, a new test is carried out at the preset level (1218) and below, a codeword is generated (1219), and the input registers are shifted (1220) according to the process described above. For example, if a match occurs at the current level, the code for that level is output. On the other hand, if no match occurs, the level will remain at MINL and an uncompressed symbol is output. The decision box 1221, again, decides whether all of the symbols in the 64-byte block have been tested, in which case the process terminates. If not, the level is doubled 1223 and the input registers are shifted by the doubled amount 1224 before a new match operation is carried out in decision box 1211. Hence, the compressor 1630; 1100 is configured to take as input a symbol of a given size and interpret that symbol as twice as many symbols of half the given size and as four times as many symbols of a quarter of the given size, etc, and compare all combinations of symbols against encoded symbols of all sizes considered. The doubling stems from the fact that the exemplary symbol sizes are chosen to follow a power series of two. If another power series is followed, someone skilled in the art should realize how to adapt the above process for that power series or to other series of symbol sizes.

Figure 13:
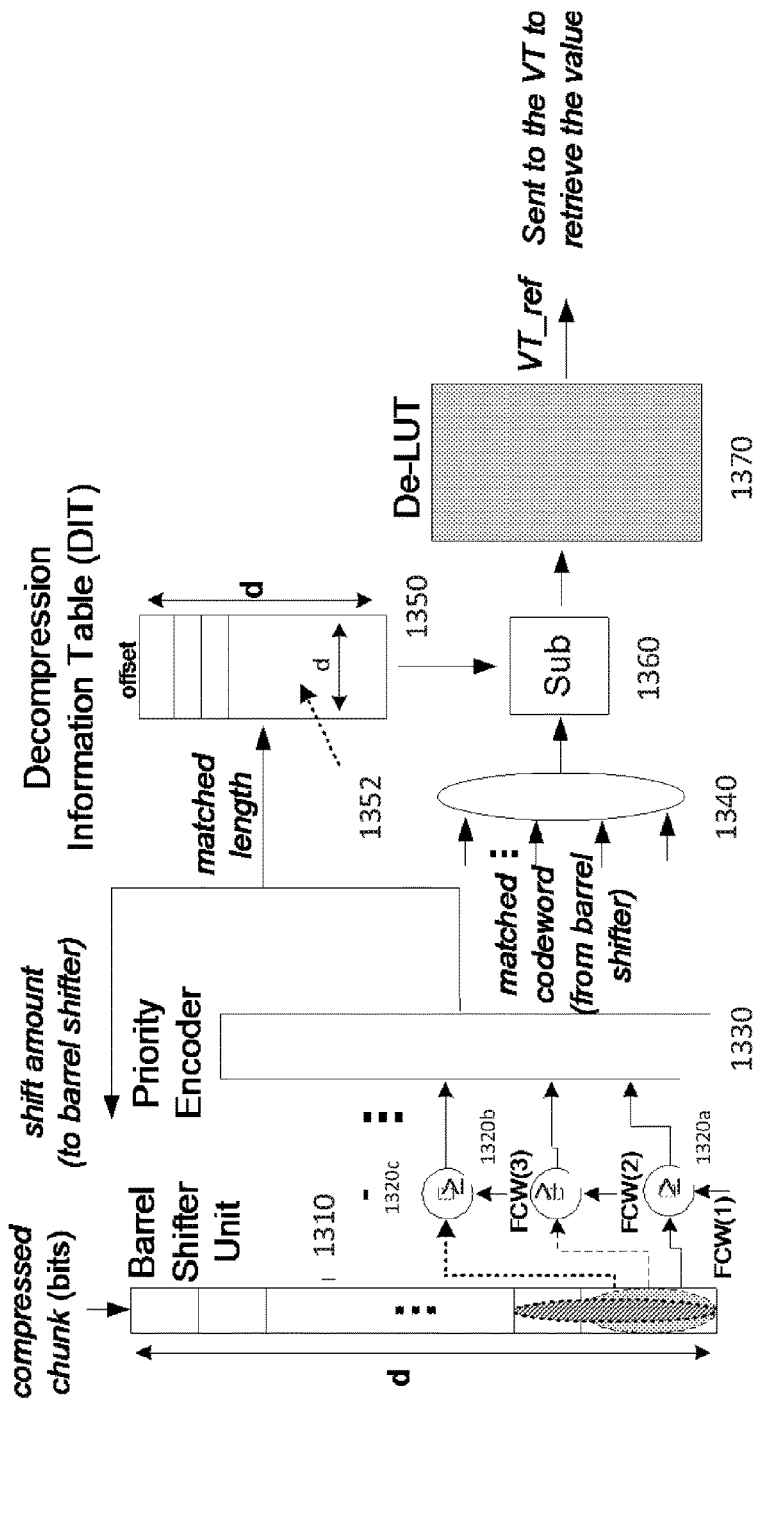
FIG. 13 depicts a Huffman decompressor (HuD) to compress fixed-sized symbols.

We now consider the process of decompressing entropy-based encoded symbols by first introducing the working of fixed-sized symbol decompression by an exemplary canonical Huffman decompressor and then extend this to deal with variable-sized symbols. FIG. 13 shows the working of an exemplary fixed-sized symbol canonical Huffman decompressor. In the embodiment of the decompression mechanism 1300, depicted in FIG. 13, decompression starts at the barrel shifter 1310, the width of which is at least d' bits (the maximum codeword length), and inputs the compressed block. The compressed block can be also kept in a buffer to provide the bit sequence to the barrel shifter based on the shifting amount. Then, all the possible coding sequences are compared with the First CodeWords (FCWs) in the respective comparators 1320a, 1320b, and 1320c, in order to detect a valid codeword. In this way, the comparator 1320a compares 1 bit, the comparator 1320b two bits, and the comparator 1320c three bits etc. Since it is possible that no codewords are generated for particular lengths, a valid bit is used and sent to the comparators 1320 (1320a, 1320b, 1320c, etc) to cancel the comparison when there are non-existing codewords for particular lengths but other alternatives can be realized by someone skilled in the art. In addition, according to the numerical sequence property, one can assume that a valid codeword will be numerically larger than any numeric value of codewords of smaller lengths. Therefore, the largest detected codeword is the only valid one which is why the priority encoder 1330 is used.

When a valid codeword has been matched, the second operation (value retrieval) begins. The length of the matched codeword is used to access the DIT 1350 to obtain the appropriate "offset", while the bits of the matched codeword are provided by the barrel shifter 1310 and are concatenated in the unit 1340. The index to the De-LUT 1370 is found by subtracting the "offset" from the matched codeword and take as many least significant bits as needed to access the De-LUT 1370. In an alternative embodiment, where the offset is positive, it would be added instead of being subtracted.

Figure 14:
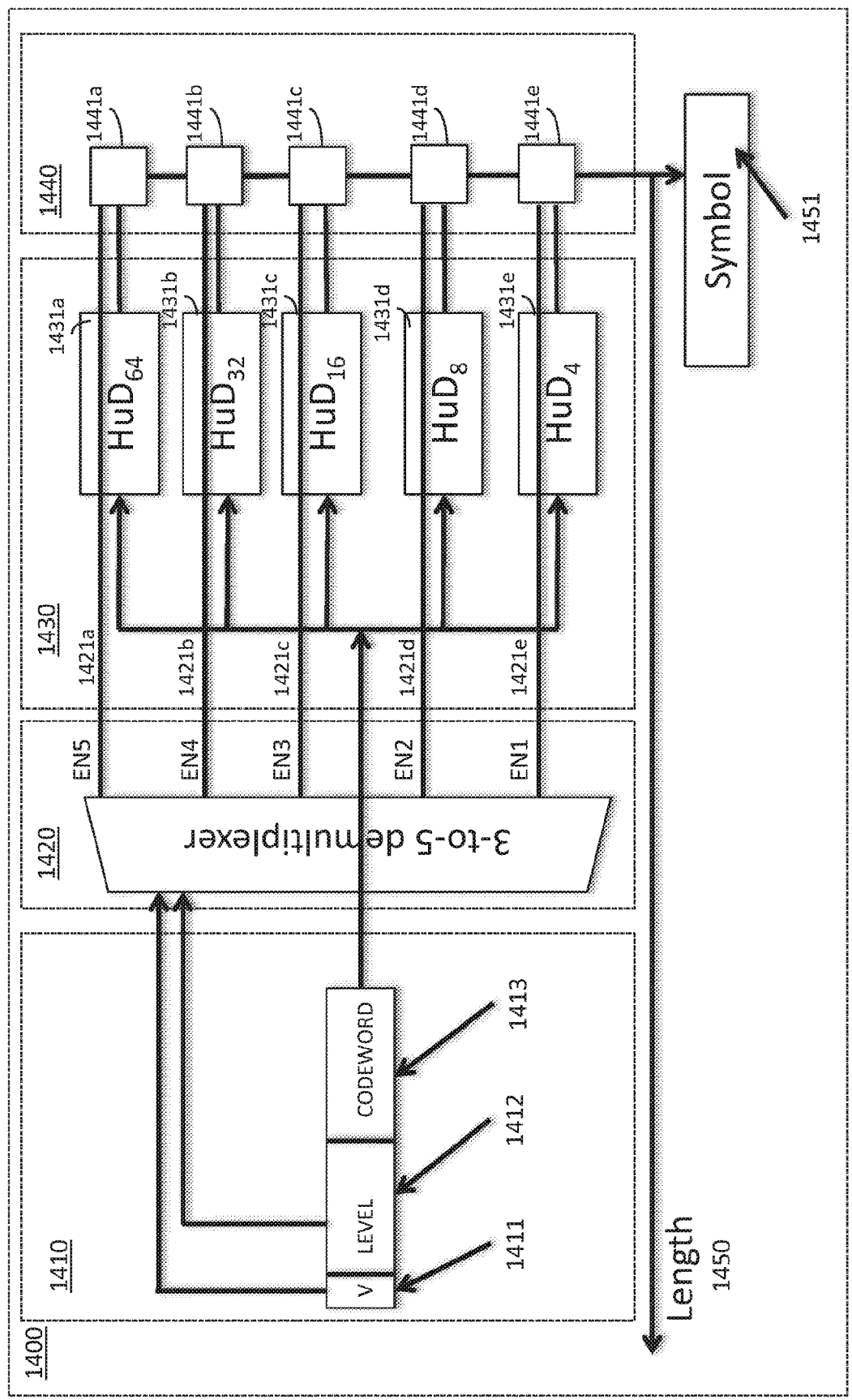
FIG. 14 depicts a Huffman decompressor (mHuD) to decompress variable-sized symbols.

Let us now consider the process of decompressing variable-sized symbols by way of an exemplary embodiment of an entropy variable-sized symbol exemplary decompressor 1400 as shown in FIG. 14. The decompressor 1400 implements, as one possible embodiment, the decompressor 1800 in FIG. 18. The assumed compressed format 1410 is already described in relation to the aforementioned description of the exemplary entropy variable-sized symbol compressor of FIG. 11 along with the compression process of FIG. 12 and comprises three fields: a valid bit 1411, a level 1412 and a codeword 1413. The exemplary decompressor assumes five symbol sizes: 4 bytes, 8 bytes, 16 bytes, 32 bytes and 64 bytes. If a compressed symbol is encountered, the level designates the size of the symbol and will feed that symbol to the designated one out of five decompressor units denoted $HuD_4$ 1431e, $HuD_8$ 1431d, $HuD_{16}$ 1431c, $HuD_{32}$ 1431b, and $HuD_{64}$ 1431a, where $HuD_i$ decompresses symbols of size i bytes. The contents of the value tables inside these decompressor units, according to the exemplary embodiment of FIG. 12, can be established during the encoding process and loaded into said value tables before the decompression process starts. The corresponding decompressor unit is selected by the 3-5 demultiplexer 1420 by the enable signals EN1 1421e, EN2 1421d, . . . , EN5 1421a. For example, $HuD_{16}$ 1431c is enabled by EN3 1421c. Likewise, since all decompressor units work in parallel, although only one may need to be activated at a time to save power, a set of five tri-state buffers 1440 can be optionally used to select one symbol 1451 out of five decompressed symbols. The code length information retrieved from the decompression process can be used to select the location of the next symbol to be decompressed (Length 1450). Alternatively, if the symbol is not compressed, an uncompressed 4-byte word is retrieved and the location of the next potentially compressed symbol can be determined.

The invention has mainly been described above with reference to a few embodiments. However, as is readily appreciated by a person skilled in the art, other embodiments than the ones disclosed above are equally possible within the scope of the invention, as defined by the appended patent claims.

In addition, it is recalled that the invention generally pertains to variable-sized symbol entropy-based compression and comprises sampling, encoding, compression and decompression of a collection of data stored in a memory. One alternative inventive aspect is a computer-based device storing a collection of data comprising symbols of variable size in a memory providing a means for sampling, encoding, compressing and decompressing said collection of data. This alternative inventive aspect comprises a means for sampling, i.e., establishment of the relative frequency of said variable-sized symbols. Furthermore, this alternative inventive aspect comprises a means to encode said variable-length symbols with respect to code length of the variable-sized symbols concerning the resulting size of the encoded collection of data built from the symbols. This alternative inventive aspect additionally comprises a means of compressing said variable-sized symbols into a format comprising information of how to decompress said collection of data. Finally, this alternative inventive aspect comprises a means of how to decompress a collection of data compressed by an entropy-based compression method using the disclosed principles to deal with variable-sized symbols to resurrect the originally uncompressed data using the disclosed method of encoding and compressing a collection of data comprising variable-sized symbols.

Another alternative inventive aspect is a method for sampling, encoding, compressing and decompressing a collection of data stored in a memory, e.g., a data buffer, a computer memory, a computer cache, or a secondary storage using symbols of variable size. This alternative inventive aspect comprises a step of sampling, i.e., how to establish the relative frequency of said variable-sized symbols. Furthermore, this alternative inventive aspect comprises a step of encoding said variable-sized symbols with respect to code length of the variable-sized symbols concerning the resulting size of the encoded collection of data stored in a memory built from the variable-sized symbols. This alternative inventive aspect additionally comprises a step of compressing said variable-size symbols stored in a memory into a format comprising information of how to decompress said collection of data. Finally, this alternative inventive aspect additionally comprises how to decompress a collection of data originally comprising variable-sized symbols and compressed by entropy-based compression using the disclosed principles to resurrect the originally uncompressed data.

Yet another alternative inventive aspect is a system operating on a computer memory storing a collection of data comprising symbols of variable size configured to sample, encode, compress and decompress said collection of data. Said system is configured to sample the symbols in a memory to establish the relative frequency of said variable-sized symbols. Furthermore, said system is configured to encode with respect to code length of the variable-sized symbols concerning the resulting size of the encoded collection of data built from the symbols. Said system is additionally configured to compress said variable-size symbols into a format comprising information of how to decompress said collection of data. Finally, said system is configured to decompress a collection of data compressed by entropy-based compression using the disclosed principles to resurrect the originally uncompressed data using the disclosed method of encoding and compressing a collection of data comprising variable-sized symbols.

Still another alternative inventive aspect is a device controlling a computer memory storing a collection of data stored in a memory comprising symbols of variable size comprising:

a sampler configured to establish the frequency of said symbols;

an encoder configured to generate an entropy-based code for said symbols;

a compressor that based on said code for said collection of data is configured to generate compressed codes and an instruction for decompressing the same; and a decompressor that based on said instruction is configured to decompress said collection of data to the original uncompressed format.

A further alternative inventive aspect is a device controlling a computer memory storing a collection of data stored in a memory comprising symbols of variable size comprising:
a sampler configured to establish the frequency of said symbols;
an encoder configured to generate an entropy-based code for said symbols;
a compressor that based on said code for said collection of data is configured to generate compressed codes and an instruction for decompressing the same; and
a decompressor that based on said instruction is configured to decompress said collection of data to the original uncompressed format.

The invention claimed is:

1. A data compression method, comprising:
obtaining a collection of data;
sampling said collection of data to establish, for a plurality of different symbol sizes, relative frequencies of symbols of the respective sizes in said collection of data;
generating a code comprising variable-length codewords by entropy encoding sampled symbols in said collection of data based on a metric which reflects the relative frequencies of the sampled symbols as well as their sizes; and
compressing symbols in said collection of data into compressed representations using the generated code, wherein the compressed representation of a symbol comprises a codeword which represents the symbol as well as metadata for decompressing the compressed representation.

2. The data compression method as defined in claim 1, wherein the metric used for generating the code is calculated as probability of symbol occurrence×symbol weight, where probability of symbol occurrence=relative frequency of symbol/number of different symbols, and symbol weight=size of symbol/maximum symbol size.

3. The data compression method as defined in claim 1, wherein the metadata comprises a first portion to indicate that the compressed representation of a symbol contains said codeword, and a second portion to indicate a size of the symbol represented by said codeword.

4. The data compression method as defined in claim 1,
wherein obtaining the collection of data involves reading the collection of data from a computer memory; and
wherein the method further involves storing the compressed representation in a computer memory.

5. A computer program product comprising code instructions which, when loaded and executed by a processing device, cause performance of the method according to claim 1.

6. A data compression device, comprising:
a sampler configured to sample a collection of data to establish, for a plurality of different symbol sizes, relative frequencies of symbols of the respective sizes in said collection of data;
an encoder configured to generate a code comprising variable-length codewords by entropy encoding sampled symbols based on a metric which reflects the relative frequencies of the sampled symbols as well as their sizes; and
a compressor configured to compress symbols in said collection of data into compressed representations using the generated code, wherein the compressed representation of a symbol comprises a codeword which represents the symbol as well as metadata for decompressing the compressed representation.

7. The data compression device as defined in claim 6, wherein the encoder is configured to calculate the metric used for generating the code as probability of symbol occurrence×symbol weight, where probability of symbol occurrence=relative frequency of symbol/number of different symbols, and symbol weight=size of symbol/maximum symbol size.

8. The data compression device as defined in claim 6, wherein the compressor is configured to generate the metadata such that it comprise a first portion to indicate that the compressed representation of a symbol contains said codeword, and a second portion to indicate a size of the symbol represented by said codeword.

9. The data compression device as defined in claim 6, wherein the sampler comprises a plurality of parallel sampler units, and wherein each sampler unit is configured to establish the relative frequency of symbols of a respective one of said plurality of different symbol sizes.

10. The data compression device as defined in claim 6, wherein the encoder is configured to compensate for a first symbol of a smaller symbol size being included in a second symbol of a larger symbol size such that the occurrence of said first symbol is accounted for in the relative frequency established for the larger symbol size but not in the relative frequency established for the smaller symbol size.

11. The data compression device as defined in claim 6, wherein the compressor comprises a plurality of parallel compressor units adapted to receive a common data block from said collection of data, wherein each compressor unit is configured to identify in said common data block a matching symbol of a respective one of said plurality of different symbol sizes, and wherein the compressor is configured to output a codeword corresponding to a symbol having the largest symbol size among matching symbols identified by the compressor units.

12. The data compression device as defined in claim 6, wherein the compressor is configured to take as input a symbol of a given size and interpret that symbol as twice as many symbols of half the given size and as four times as many symbols of a quarter of the given size, etc, and compare all combinations of symbols against encoded symbols of all sizes considered.

13. A data decompression method, comprising:
obtaining a compressed block comprising compressed representations of variable-sized symbols;
retrieving a compressed representation comprised in said compressed block;
retrieving metadata comprised in said compressed representation;
retrieving a codeword comprised in said compressed representation; and
decompressing said retrieved codeword into a symbol having one among a plurality of different sizes using the retrieved metadata and a code comprising variable-length, entropy encoded codewords, the entropy encoding of said codewords being based on a metric which reflects relative frequencies of symbols as well as their sizes.

14. The data decompression method as defined in claim 13, wherein the retrieved metadata comprises a first portion indicating that the retrieved compressed representation of a symbol contains said codeword, and a second portion to indicate a size of the symbol represented by said codeword.

15. The data decompression method as defined in claim 13,
wherein obtaining the compressed block involves reading the compressed block from a computer memory; and
wherein the method further involves storing the decompressed symbol in a computer memory.

16. A computer program product comprising code instructions which, when loaded and executed by a processing device, cause performance of the method according to claim 13.

17. A data decompression device comprising a decompressor,
the decompressor being configured to obtain a compressed block comprising compressed representations of variable-sized symbols;
the decompressor being configured to retrieve a compressed representation in said compressed block;
the decompressor being configured to retrieve metadata comprised in said compressed representation;
the decompressor being configured to retrieve a codeword comprised in said compressed representation; and
the decompressor being configured to decompress said retrieved codeword into a symbol having one among a plurality of different sizes using the retrieved metadata and a code comprising variable-length, entropy encoded codewords, the entropy encoding of said codewords being based on a metric which reflects relative frequencies of symbols as well as their sizes.

18. The data decompression device as defined in claim 17, wherein the retrieved metadata comprises a first portion indicating that the retrieved compressed representation of a symbol contains said codeword, and a second portion to indicate a size of the symbol represented by said codeword.

19. A system comprising one or more memories, a data compression device according to claim 6 and a data decompression device according to claim 17.

20. The system as defined in claim 19, wherein the system is a computer system and wherein said one or more memories are selected from the group consisting of:
cache memories,
random access memories, and
secondary storages.

21. The system as defined in claim 20, wherein the system is a data communication system and wherein said one or more memories are data buffers.

* * * * *